United States Patent
Noda et al.

(10) Patent No.: US 12,309,934 B2
(45) Date of Patent: May 20, 2025

(54) CIRCUIT BOARD WITH CONVEX SHAPED POST, LIGHT EMITTING DEVICE, AND MANUFACTURING METHOD THEREFOR

(71) Applicant: NICHIA CORPORATION, Anan (JP)

(72) Inventors: Yosuke Noda, Tokushima (JP); Masaaki Katsumata, Anan (JP); Masakazu Sakamoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 193 days.

(21) Appl. No.: 18/068,397

(22) Filed: Dec. 19, 2022

(65) Prior Publication Data

US 2023/0199964 A1    Jun. 22, 2023

(30) Foreign Application Priority Data

Dec. 20, 2021  (JP) .................... 2021-206159

(51) Int. Cl.
*H05K 1/18*   (2006.01)
*H05K 3/30*   (2006.01)
*H05K 3/40*   (2006.01)

(52) U.S. Cl.
CPC ............. *H05K 1/181* (2013.01); *H05K 3/303* (2013.01); *H05K 3/4015* (2013.01);
(Continued)

(58) Field of Classification Search
None
See application file for complete search history.

(56) References Cited

U.S. PATENT DOCUMENTS 4,389,268 A * 6/1983 Oshima ............. B32B 7/12
427/538
4,735,847 A * 4/1988 Fujiwara ............ H01R 4/04
428/209
(Continued)

FOREIGN PATENT DOCUMENTS

JP    2004319644 A    11/2004
JP    2008091814 A     4/2008
(Continued)

OTHER PUBLICATIONS

Original and Translation of JP2014120529 (Year: 2014).*
(Continued)

*Primary Examiner* — Binh B Tran
*Assistant Examiner* — Muhammed Azam
(74) *Attorney, Agent, or Firm* — Global IP Counselors, LLP

(57) ABSTRACT

A method for manufacturing a circuit board includes: providing a first board including a post portion, and a second board defining an opening portion extending through a base material, the base material including a circuit pattern disposed on a first surface and an adhesive member disposed on a side of a second surface; and bonding the first board and the second board using the adhesive member by pressurizing and heating the first board and the second board in a state of the post portion being inserted in the opening portion and a top surface of the post portion being exposed from the second board. In a plan view, the second board includes a base material exposed portion. In the bonding, the adhesive member melted by the pressurizing and the heating is disposed between a lateral surface of the post portion and the second board.

21 Claims, 30 Drawing Sheets

(52) U.S. Cl.
CPC ........... *H05K 2201/0376* (2013.01); *H05K 2201/10106* (2013.01); *H05K 2203/1105* (2013.01)

(56) References Cited

U.S. PATENT DOCUMENTS

| | | | | |
|---|---|---|---|---|
| 5,220,487 | A * | 6/1993 | Patel | H01L 23/367 257/E23.125 |
| 5,309,629 | A * | 5/1994 | Traskos | H05K 3/4629 174/262 |
| 5,329,695 | A * | 7/1994 | Traskos | H05K 3/4632 156/89.18 |
| 5,589,250 | A * | 12/1996 | Asai | G03F 7/11 428/209 |
| 5,644,163 | A * | 7/1997 | Tsuji | H01L 23/13 257/713 |
| 5,805,417 | A * | 9/1998 | Nakagawa | G06F 1/203 361/679.09 |
| 6,057,601 | A * | 5/2000 | Lau | H01L 23/3128 257/730 |
| 6,313,525 | B1 * | 11/2001 | Sasano | H01L 27/14618 257/784 |
| 6,936,855 | B1 * | 8/2005 | Harrah | F21K 9/00 257/59 |
| 7,690,817 | B2 * | 4/2010 | Sanpei | H05K 1/0203 362/267 |
| 7,948,076 | B2 * | 5/2011 | Wang | H10H 20/8506 257/E23.101 |
| 7,951,622 | B2 * | 5/2011 | Lin | H05K 1/0204 438/118 |
| 8,003,416 | B2 * | 8/2011 | Lin | H01L 21/486 438/118 |
| 8,034,645 | B2 * | 10/2011 | Lin | H01L 21/486 438/26 |
| 8,062,912 | B2 * | 11/2011 | Wang | H05K 1/0204 438/22 |
| 8,067,784 | B2 * | 11/2011 | Lin | H01L 21/486 257/712 |
| 8,076,182 | B2 * | 12/2011 | Lin | H01L 21/486 438/118 |
| 8,110,446 | B2 * | 2/2012 | Lin | H01L 21/486 257/E33.056 |
| 8,129,742 | B2 * | 3/2012 | Lin | H01L 21/486 257/E23.102 |
| 8,148,747 | B2 * | 4/2012 | Lin | H01L 21/486 438/122 |
| 8,153,477 | B2 * | 4/2012 | Lin | H05K 1/0204 257/E23.102 |
| 8,178,395 | B2 * | 5/2012 | Lin | H05K 1/0204 438/122 |
| 8,193,556 | B2 * | 6/2012 | Lin | H05K 1/021 257/711 |
| 8,203,167 | B2 * | 6/2012 | Lin | H01L 21/486 257/99 |
| 8,207,019 | B2 * | 6/2012 | Lin | H10H 20/8582 257/E23.102 |
| 8,207,553 | B2 * | 6/2012 | Lin | H01L 21/486 257/711 |
| 8,212,279 | B2 * | 7/2012 | Lin | H10H 20/8506 257/99 |
| 8,232,576 | B1 * | 7/2012 | Lin | H05K 1/021 257/711 |
| 8,236,618 | B2 * | 8/2012 | Lin | H01L 21/486 257/E23.102 |
| 8,236,619 | B2 * | 8/2012 | Lin | H01L 24/83 438/118 |
| 8,283,211 | B2 * | 10/2012 | Lin | H10H 20/8582 257/E33.056 |
| 8,310,043 | B2 * | 11/2012 | Lin | H05K 1/0204 438/118 |
| 8,314,438 | B2 * | 11/2012 | Lin | H05K 1/021 257/98 |
| 8,329,510 | B2 * | 12/2012 | Lin | H01L 23/60 438/118 |
| 8,342,884 | B2 * | 1/2013 | Bishop | F21K 9/27 362/249.02 |
| 8,373,071 | B2 * | 2/2013 | Yu | H05K 3/107 174/262 |
| 8,382,322 | B2 * | 2/2013 | Bishop | F21V 23/06 362/249.02 |
| 8,415,703 | B2 * | 4/2013 | Lin | H05K 1/0204 257/E33.075 |
| 8,698,186 | B2 * | 4/2014 | Nguyen | H05K 1/0203 438/22 |
| 8,705,908 | B2 * | 4/2014 | Sameshima | G02B 6/43 385/32 |
| 8,896,016 | B2 * | 11/2014 | Sakaguchi | H10H 20/857 257/89 |
| 9,018,667 | B2 * | 4/2015 | Lin | H05K 1/0204 257/99 |
| 9,148,949 | B2 * | 9/2015 | Zhou | H05K 1/189 |
| 9,392,687 | B2 * | 7/2016 | Lee | H05K 1/0204 |
| 9,532,444 | B2 * | 12/2016 | Osuga | H05K 1/0373 |
| 9,941,451 | B2 * | 4/2018 | Kishikawa | H01L 33/56 |
| 10,028,379 | B2 * | 7/2018 | Na | H05K 3/303 |
| 10,477,692 | B2 * | 11/2019 | Sakamoto | H05K 3/061 |
| 10,772,192 | B2 * | 9/2020 | Isaac | H05K 3/368 |
| 10,772,204 | B2 * | 9/2020 | Baba | H05K 1/181 |
| 10,833,054 | B2 * | 11/2020 | Chan | H05K 3/284 |
| 11,284,507 | B2 * | 3/2022 | Ogawa | H05K 3/0014 |
| 11,576,261 | B2 * | 2/2023 | Jung | H05K 1/181 |
| 12,035,481 | B2 * | 7/2024 | Sakamoto | H05K 3/4644 |
| 2001/0030866 | A1 * | 10/2001 | Hochstein | F21V 29/70 362/547 |
| 2005/0073044 | A1 * | 4/2005 | Tomabechi | H05K 1/0204 257/E23.101 |
| 2005/0221537 | A1 * | 10/2005 | Tomabechi | H01L 21/4857 257/E23.101 |
| 2006/0191715 | A1 * | 8/2006 | Koyama | H05K 3/4069 174/262 |
| 2007/0267642 | A1 * | 11/2007 | Erchak | H10H 20/8582 257/98 |
| 2008/0019133 | A1 * | 1/2008 | Kim | H10H 20/8582 362/294 |
| 2010/0181594 | A1 * | 7/2010 | Lin | H01L 21/486 257/E33.056 |
| 2012/0279760 | A1 * | 11/2012 | Sun | H01L 33/642 29/829 |
| 2015/0070862 | A1 | 3/2015 | Naganuma et al. | |
| 2015/0289375 | A1 * | 10/2015 | Ozaki | H05K 1/181 336/107 |
| 2015/0369467 | A1 * | 12/2015 | Saito | H05K 3/0011 362/345 |
| 2016/0150655 | A1 * | 5/2016 | Takenaka | H05K 5/0056 361/709 |
| 2017/0318661 | A1 * | 11/2017 | Matsunaga | H05K 1/111 |
| 2018/0045903 | A1 * | 2/2018 | Nakagawa | G02B 6/4243 |
| 2020/0136347 | A1 * | 4/2020 | Charlebois | H01S 5/02234 |
| 2020/0344881 | A1 * | 10/2020 | Tonaru | H05K 3/303 |
| 2021/0160997 | A1 * | 5/2021 | Kirkpatrick | H05K 7/20509 |
| 2022/0149022 | A1 * | 5/2022 | Goto | H01J 45/00 |
| 2023/0130570 | A1 * | 4/2023 | Abe | H05K 1/14 361/807 |
| 2023/0199964 | A1 * | 6/2023 | Noda | H05K 1/0204 361/760 |
| 2024/0206066 | A1 * | 6/2024 | Chun | H05K 1/142 |

FOREIGN PATENT DOCUMENTS

| | | |
|---|---|---|
| JP | 2009088116 A | 4/2009 |
| JP | 2011091111 A | 5/2011 |
| JP | 2013058619 A | 3/2013 |
| JP | 2014120529 A | 6/2014 |
| JP | 2015079777 A | 4/2015 |
| JP | 2016004851 A | 1/2016 |

(56) References Cited

FOREIGN PATENT DOCUMENTS

| | | |
|---|---|---|
| JP | 2017050539 A | 3/2017 |
| JP | 2017073513 A | 4/2017 |

OTHER PUBLICATIONS

Original and Translation of JP2009088116 (Year: 2009).*
Original and Translation of JP2017050539 (Year: 2017).*
Original and Translation of JP2017204619 (Year: 2017).*

\* cited by examiner

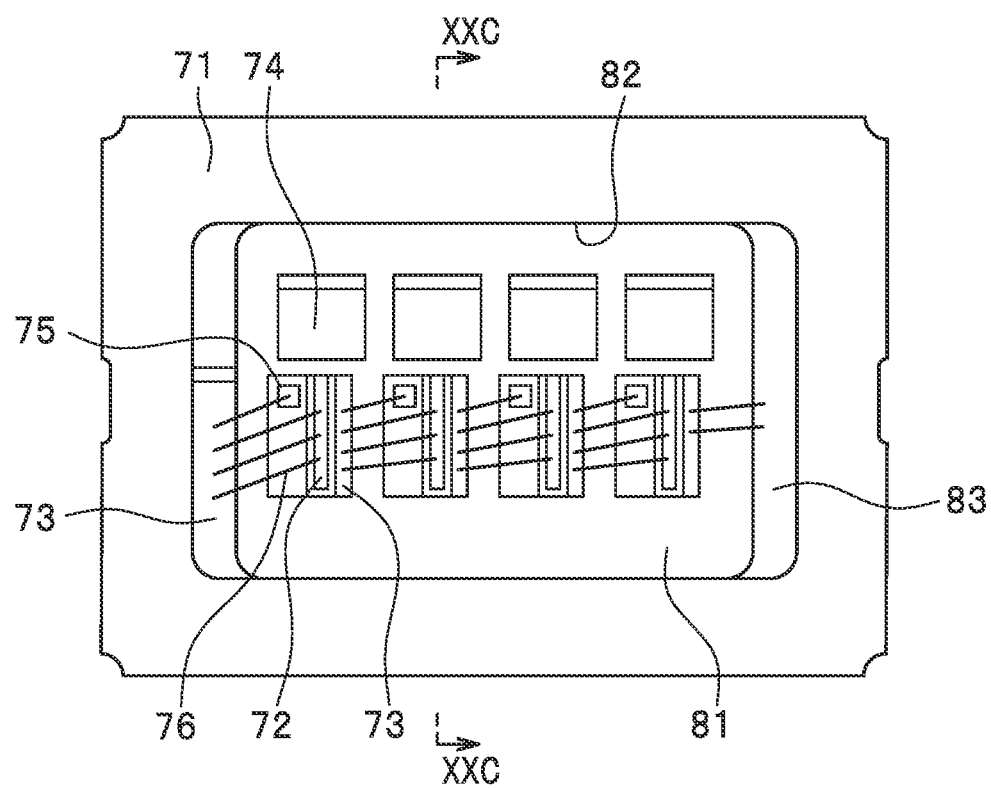

CIRCUIT BOARD WITH CONVEX SHAPED POST, LIGHT EMITTING DEVICE, AND MANUFACTURING METHOD THEREFOR

CROSS-REFERENCE TO RELATED APPLICATIONS

The present application claims priority under 35 U.S.C. § 119 to Japanese Patent Application No. 2021-206159, filed Dec. 20, 2021, the disclosure of which is hereby incorporated herein by reference in its entirety.

BACKGROUND

1. Technical Field

The present disclosure relates to a circuit board, a light emitting device, and a manufacturing method therefor.

2. Description of Related Art

In the related art, a circuit board having improved heat dissipation of mounted electronic components is known. For example, Japanese Unexamined Patent Application Publication No. 2008-91814 discloses a circuit board including a base plate portion made of metal, a circuit pattern formed on the base plate portion via an insulating layer, and an electronic component mounting portion provided on the base plate portion and to which an electronic component electrically connected to the circuit pattern is directly joined. Furthermore, for example, Japanese Unexamined Patent Application Publication No. 2017-50539 discloses a wiring board layered body including a metal plate having a plurality of convex portions on a surface, a wiring board having a plurality of second openings in portions corresponding to the convex portions, and an insulating layer interposed between the metal plate and the wiring board and containing a cured product of thermosetting resin. In manufacturing such layered boards, a method is used in which a copper plate on which a post portion is formed and a wiring board on which a copper foil circuit pattern is formed are bonded to each other to form a circuit board.

SUMMARY

An object of the present disclosure is to provide a circuit board, a light emitting device, and a manufacturing method therefor, which can prevent contact between a post portion and a circuit pattern of a wiring board.

A method for manufacturing a circuit board according to an embodiment of the present disclosure includes: providing a first board including a post portion having a convex shape on a top surface of the first board, and a second board defining an opening portion extending through a base material in a thickness direction, the base material including a circuit pattern disposed on a first surface of the base material and an adhesive member disposed on a side of a second surface of the base material opposite to the first surface, the circuit pattern including a pair of electrodes; and bonding the first board and the second board using the adhesive member by pressurizing and heating the first board and the second board in a state of the post portion being inserted in the opening portion and a top surface of the post portion being exposed from the second board, and the top surface of the first board excluding the post portion and the second surface of the base material in the second board facing each other with the adhesive member being interposed therebetween. In a plan view, the second board includes a base material exposed portion where the base material protrudes in a direction toward the opening portion further than the circuit pattern and is exposed from the circuit pattern. In the bonding, the adhesive member melted by the pressurizing and the heating is disposed between a lateral surface of the post portion and the second board.

A method for manufacturing a light emitting device according to an embodiment of the present disclosure includes manufacturing a circuit board by the method for manufacturing the circuit board disclosed in the embodiment and placing a light emitting component on the post portion of the circuit board.

A circuit board according to an embodiment of the present disclosure includes a first board and a second board. The first board includes a post portion having a convex shape on a top surface of the first board. The second board defines an opening portion extending through a base material in a thickness direction. The base material includes a circuit pattern disposed on a first surface of the base material and an adhesive member disposed on a side of a second surface of the base material opposite to the first surface. The circuit pattern includes a pair of electrodes. The post portion is arranged in the opening portion with a top surface of the post portion is exposed from the second board. The top surface of the first board excluding the post portion and the second surface of the base material in the second board face each other with the adhesive member being interposed therebetween. In a plan view, the second board includes a base material exposed portion where the base material protrudes in a direction toward the opening portion further than the circuit pattern and is exposed from the circuit pattern. The adhesive member is disposed between a lateral surface of the post portion and the second board.

A light emitting device according to an embodiment of the present disclosure includes the circuit board disclosed in the embodiment and a light emitting component placed on the post portion of the circuit board.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

FIG. 20B is a plan view schematically illustrating the configuration of the light emitting component in a package.

DETAILED DESCRIPTION OF EMBODIMENT

Embodiments

Figure 1A:
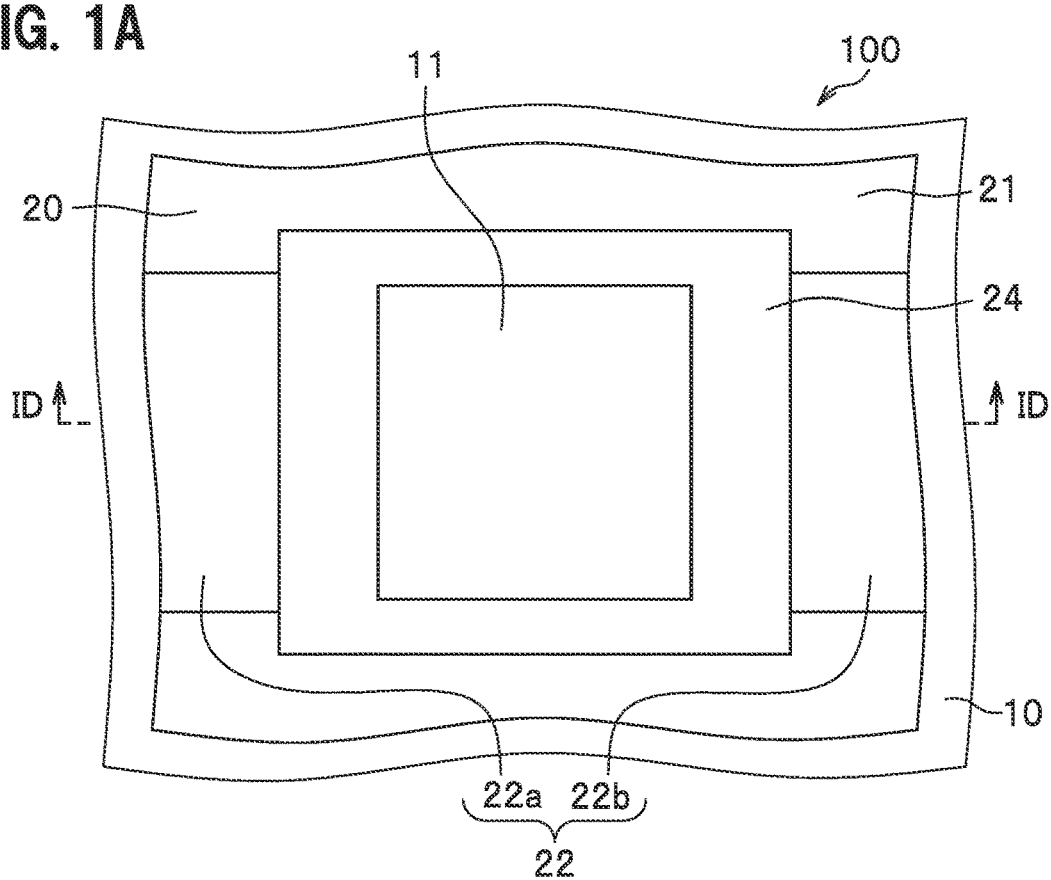
FIG. 1A is a plan view schematically illustrating an example of a circuit board according to an embodiment.

Embodiments will be described below with reference to the drawings.

However, the embodiments described below are examples of a circuit board, a light emitting device, and a manufacturing method thereof for embodying the technical idea of the present embodiment and are not limited to the following. In addition, dimensions, materials, shapes, relative arrangements, or the like of components described in the embodiments are not intended to limit the scope of the present invention thereto, unless otherwise specified, and are merely exemplary. Note that, size, positional relationship, and the like of members illustrated in the drawings may be exaggerated or simplified for clarity of description. In the embodiments, "covering" is not limited to a case of direct contact, but also includes a case of indirectly covering, for example, via another member. Furthermore, "disposing" is not limited to a case of direct contact, but also includes a case of indirectly disposing, for example, via another member.

Circuit Board

Figure 1B:
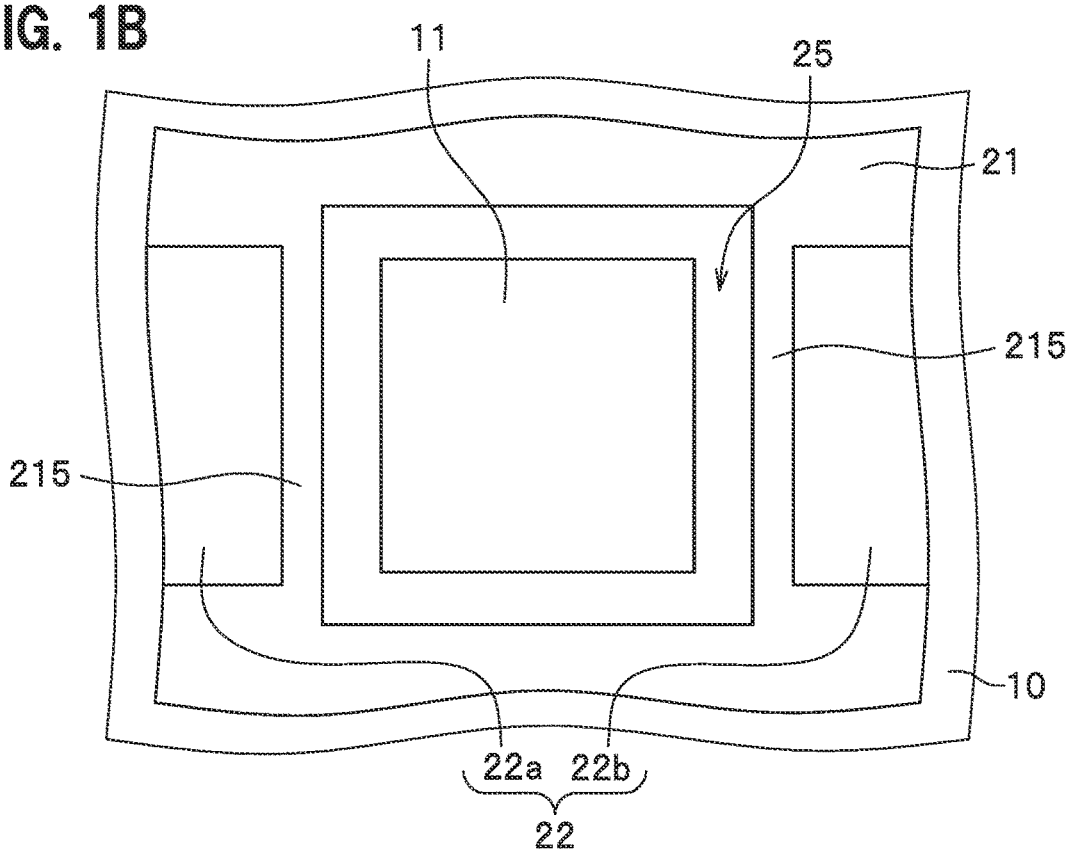
FIG. 1B is a plan view in which an adhesive member is removed in FIG. 1A.
Figure 1C:
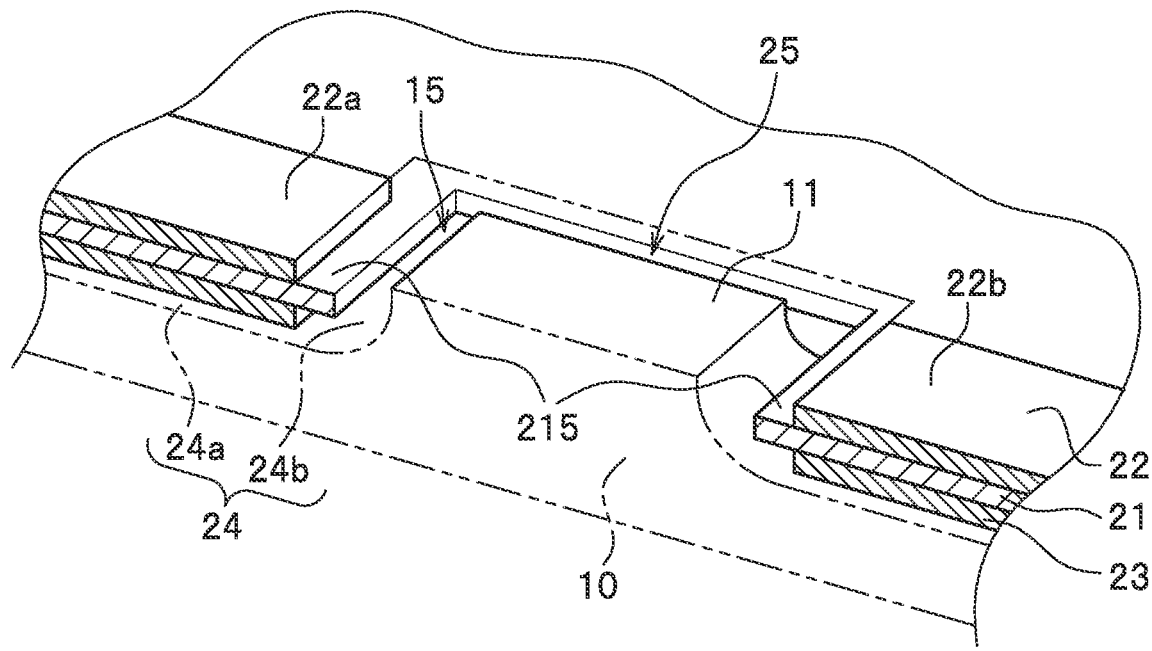
FIG. 1C is a perspective view schematically illustrating the relationship between an opening portion and a base material exposed portion.
Figure 1D:
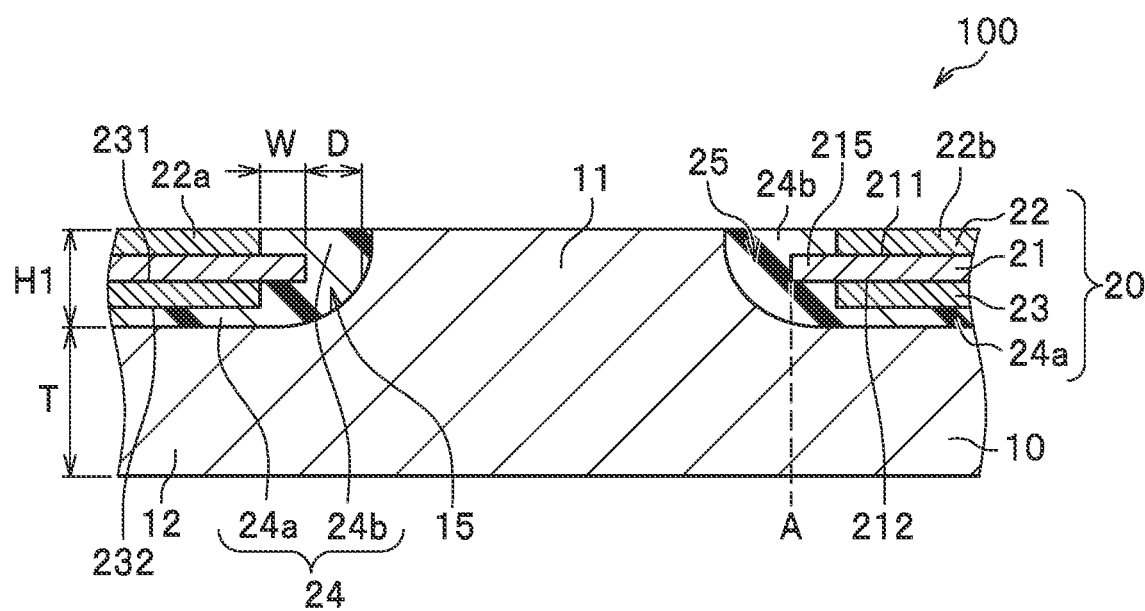
FIG. 1D is a schematic cross-sectional view taken along line ID-ID of FIG. 1A.

FIG. 1A is a plan view schematically illustrating an example of a circuit board according to an embodiment. FIG. 1B is a plan view in which an adhesive member is removed in FIG. 1A. FIG. 1C is a perspective view schematically illustrating the relationship between an opening portion and a base material exposed portion. FIG. 1D is a schematic cross-sectional view taken along line ID-ID of FIG. 1A.

The circuit board 100 includes a first board 10 including a post portion 11 having a convex shape formed on a top surface of the first board 10 and a second board 20 defining an opening portion 25 extending through a base material 21 in a thickness direction. The base material includes a circuit pattern 22 disposed on a first surface 211 and an adhesive member 24a disposed on a side of a second surface 212 opposite to the first surface 211. The circuit pattern includes a pair of electrodes 22a and 22b. A top surface of the post portion 11 is exposed from the opening portion 25, and a top surface of the first board 10 excluding the post portion 11 and the second surface 212 of the base material 21 in the second board 20 face each other. Furthermore, in the plan view, the second board 20 includes a base material exposed portion 215 where the base material 21 protrudes in a direction toward the opening portion 25 further than the circuit pattern 22 and is exposed, and an adhesive member 24b is disposed between a lateral surface of the post portion 11 and the second board 20.

In the present embodiment, in the circuit board 100, a metal layer 23 is disposed on the second surface 212 of the base material 21, the adhesive member 24a is disposed on a surface of the metal layer 23 opposite to a surface proximate to the base material 21 side, and the base material exposed portion 215 is exposed from the metal layer 23.

The first board 10 includes a flat plate portion 12 and the post portion 11 having the convex shape protruding from the flat plate portion 12. The flat plate portion 12 and the post portion 11 are integrally formed. Lateral surfaces of the post portion 11 have a curved shape that is convex inward on the lateral surfaces facing each other in a cross-sectional view. However, the lateral surfaces of the post portion 11 may have a curved shape that is convex outward, an inclined linear shape, or a vertical linear shape on the lateral surfaces facing each other. The post portion 11 is formed by etching or pressing the board. A thickness T of the flat plate portion 12 is preferably in a range from 1 mm to 3 mm. If the thickness T of the flat plate portion 12 is 1 mm or greater, the strength of the first board 10 can be improved. On the other hand, if the thickness T is 3 mm or less, the first board 10 can be thinned. Note that when a slight difference occurs in thickness depending on a portion of the flat plate portion 12 at the time of formation of the post portion 11, the thickness T can be an average thickness of the flat plate portion 12. The post portion 11 is formed in a square shape in the plan view but may be a polygon such as a rectangle or a trapezoid, a circle, an ellipse, or any other shapes. Additionally, the corner portion of the post portion 11 is formed at a right angle but may be rounded.

A height H1 of the post portion 11, which is a height from a top surface of the first board 10 excluding the post portion 11, that is, a top surface of the flat plate portion 12 to a top surface of the post portion 11, is preferably in a range from 50 μm to 200 μm. If the height H1 of the post portion 11 is 50 μm or greater, the thickness of the second board 20 to be disposed on the first board 10 is easily adjusted. On the other hand, if the height H1 is 200 μm or less, the first board 10 can be thinned. The lower the post portion 11, the easier it is to process and also reduce a variation in the height H1. Note that when a slight difference occurs in the thickness depending on the portion of the flat plate portion 12 at the time of formation of the post portion 11, the height H1 can be an average height from the top surface of the flat plate portion 12 to the top surface of the post portion 11.

The first board 10 is preferably a metal plate using a metal material. By configuring the first board 10 to be a metal plate, heat dissipation functions that emit heat generated from a light emitting component 50, or the like, become excellent. As the metal material of the first board 10, for example, a single-component metal such as Cu, Ag, Al, Ni, Rh, Au, Ti, Pt, Pd, Mo, Cr, and W, or an alloy containing these metals can be used. In particular, the first board 10 is preferably a copper plate using Cu from the perspective of heat dissipation and economic efficiency. For example, the first board 10 is preferably made of a material containing 90 mass % or greater of copper. A material containing 95 mass % or greater of copper is more preferable, and a material containing 99 mass % or greater of copper is even more preferable.

The second board 20 includes the base material 21, the circuit pattern 22 disposed on the first surface 211 of the base material 21, the metal layer 23 disposed on the second surface 212 of the base material 21, and the adhesive member 24a disposed proximate to the second surface 212 of the base material 21. The second board 20 is illustrated by a single-sided wiring structure, but when more complicated circuit formation is required by design, a multilayer board may be used.

As illustrated in FIG. 1D, the adhesive member 24b adjacent to the post portion 11 and the adhesive member 24b disposed on the first surface 211 of the base material 21 at the base material exposed portion 215 are portions where the adhesive member 24a previously disposed proximate to the second surface 212 of the base material 21 is melted and installed. For that reason, it is assumed that the adhesive member constituting the second board 20 of the present embodiment is the adhesive member 24a disposed proximate to the second surface 212 of the base material 21, and the adhesive member 24b disposed between the post portion 11 and the second board 20 is not included in the second board 20. That is, the adhesive member 24a disposed on a second surface 232 of the metal layer 23 and the adhesive member 24a disposed on the second surface 212 of the base material 21 at the base material exposed portion 215 are adhesive members constituting the second board 20 (see FIGS. 1D and 8B). In other words, adhesive members on the base material 21 side of the broken lines A in FIG. 1D are the adhesive members 24a constituting the second board 20. Note that the space between the post portion 11 and the second board 20 is between the post portion 11 and the circuit pattern 22, between the post portion 11 and the base material 21, and between the post portion 11 and the adhesive member 24a.

The base material 21 is insulating, for example, a film-shaped polyimide can be used. The thickness of the base material 21 is preferably in a range from 12 μm to 50 μm. If the thickness of the base material 21 is 12 μm or greater, the strength of the base material 21 can be improved. On the other hand, if the thickness is 50 μm or less, the second board 20 can be thinned. Of course, the thickness of the base material 21 can be adjusted as appropriate corresponding to the height H1 of the post portion 11. Note that, as the base material 21, a glass epoxy obtained by impregnating one or a plurality of glass cloths with a thermosetting insulating resin such as an epoxy resin and curing the thermosetting insulating resin, a liquid crystal polymer, and the like, may be used. When the base material 21 is a glass epoxy, the thickness can be, for example, in a range from 50 μm to 180 μm, and preferably in a range from 20 μm to 150 μm relative to the height of the post portion 11.

The circuit pattern 22 is a layer formed by removing a part of the metal layer as will be described below and includes a pair of electrodes including a first electrode 22a and a second electrode 22b. The first electrode 22a and the second electrode 22b are installed so that their widths are, for example, less than the width of the opening portion 25 and substantially identical to the width of the post portion 11.

The circuit pattern 22 can use a metal material and can suitably use, for example, a single-component metal such as Cu, Ag, Al, Ni, Rh, Au, Ti, Pt, Pd, Mo, Cr, and W, or an alloy containing these metals. In particular, the circuit pattern 22 is preferably a copper foil using Cu from the perspective of conductivity and economic efficiency. For example, the circuit pattern 22 is preferably made of a material containing 90 mass % or greater of copper. A material containing 95 mass % or greater of copper is more preferable, and a material containing 99 mass % or greater of copper is even more preferable.

The thickness of the circuit pattern 22 is preferably in a range from 12 μm to 70 μm. If the thickness of the circuit pattern 22 is 12 μm or greater, the circuit pattern 22 is easily formed. On the other hand, if the thickness is 70 μm or less, the second board 20 can be thinned. Preferably, the first electrode 22a and the second electrode 22b of the circuit pattern 22 have the same thickness. With such a configuration, the first electrode 22a and the second electrode 22b can be easily formed, and a light emitting component 50 can be easily placed.

The adhesive member 24 is an insulating member that adheres the first board 10 and the second board 20. The adhesive member 24 includes the adhesive member 24a disposed proximate to the second surface 212 of the base material 21 and the adhesive member 24b disposed between the post portion 11 and the second board 20. The adhesive member 24a is disposed on the second surface 212 of the base material 21 at the base material exposed portion 215 and the second surface 232 of the metal layer 23. The thickness of the adhesive member 24a between the flat plate portion 12 of the first board 10 and the metal layer 23 is preferably in a range from 20 μm to 100 μm. If the thickness of the adhesive member 24a is 20 μm or greater, the adhesive strength can be improved. On the other hand, if the thickness is 100 μm or less, the second board 20 can be thinned. At the same time, the metal layer 23 can be embedded in the adhesive member 24 without voids.

As the adhesive member 24, for example, a heat-resistant resin sheet, a UV curable sheet, or the like can be used. However, as will be described below, in the manufacturing process of the circuit board 100, because the adhesive member 24b is disposed between the post portion 11 and the second board 20 by melting the adhesive member 24a, a material having sufficient fluidity before curing due to pressurization and heating is used. Examples of the material of the adhesive member 24 include epoxy resin, acrylic resin, urethane resin, silicone resin, and the like. The elastic modulus of the adhesive member 24 is preferably 1 GPa or less, and more preferably 500 MPa or less. By using such an adhesive member 24 having a low elastic modulus, stress due to the difference in linear expansion coefficient between the first board 10 and the second board 20 can be reduced, so that reliability such as cooling/heating cycle characteristics can be improved.

The metal layer 23 is disposed between the base material 21 and the adhesive member 24a, and the base material exposed portion 215 is exposed from the metal layer 23. The metal layer 23 includes a first surface 231 and the second surface 232 opposite to the first surface 231. The first surface 231 faces the second surface 212 of the base material 21, and the adhesive member 24a is disposed on the second surface 232. The circuit board 100 can improve heat dissipation by having the second board 20 include the metal layer 23. As the material of the metal layer 23, for example, those exemplified for the circuit pattern 22 can be used.

In the circuit board 100, the top surface of the post portion 11, the top surface of the adhesive member 24b disposed between the post portion 11 and the second board 20, and the top surface of the circuit pattern 22 may be flush with each other. When the top surface of the post portion 11, the top surface of the adhesive member 24b, and the top surface of the circuit pattern 22 are not flush with each other, a part of a resist 30 may be thin or a void may be generated at the time of formation of the resist 30 when manufacturing a light emitting device 200. This results in a concern that the thickness of the resist 30 becomes uneven. However, by the top surface of the post portion 11, the top surface of the adhesive member 24b, and the top surface of the circuit pattern 22 being flush with each other, the generation of a void can be prevented at the time of the formation of the resist 30 and the resist 30 can be formed with a uniform film thickness. For that reason, when the light emitting device 200 is manufacturing, it becomes easy to place the light emitting component 50 on the circuit board 100.

Note that the "flush with" means that the top surfaces of the respective members are located at a portion of substantially the same plane within the range of plus or minus 10%, and also includes a case in which the top surfaces of the respective members are separated from each other.

As illustrated in FIGS. 1B and 1C, the second board 20 includes the opening portion 25 that exposes the post portion 11. Note that the opening portion 25 of the present embodiment also includes a portion that penetrates the adhesive member 24a (see FIG. 8B). In the circuit board 100, the adhesive member 24b is disposed between the lateral surface of the post portion 11 and an inner lateral surface of the opening portion 25 (gap 15), but for the purpose of convenience, a state in which the adhesive member 24b is removed will be described below as an example.

The opening portion 25 is formed in a size such that the entire post portion 11 is housed. The lateral surface of the post portion 11 and the inner lateral surface of the opening portion 25 preferably include the gap 15. The gap 15 is formed between the post portion 11 and the base material 21 and between the post portion 11 and the adhesive member 24a, and the adhesive member 24b is disposed in the gap 15. The gap 15 makes it easy to insert the post portion 11 into the opening portion 25. Because the circuit board 100 has such a gap 15, an opening of the opening portion 25 is formed greater than the post portion 11 in a plan view. The plan view shape of the opening portion 25 may be determined appropriately according to the shape of the post portion 11. In the present embodiment, the plan view shape of the opening portion 25 is formed in a square shape according to the shape of the post portion 11. In the plan view, the shape of the top surface of the post portion 11 and the shape of the opening portion 25 are preferably similar to each other. An area of the opening portion 25 is preferably in a range from 1.05 times to 2 times an area of the top surface of the post portion 11, and more preferably in a range from 1.1 times to 1.8 times.

The second board 20 includes the base material exposed portions 215. Each of the base material exposed portions 215 is a portion where the base material 21 is exposed from the circuit pattern 22. Each of the base material exposed portions 215 is also exposed from the metal layer 23. In the present embodiment, one of the base material exposed portions 215 is formed at a position of one of the pair of electrodes 22a and 22b proximate to the opening portion 25 and protrudes in a direction toward the opening portion 25. The other of the base material exposed portions 215 is formed at a position of the other of the pair of electrodes 22a and 22b proximate to the opening portion 25 and protrudes in a direction toward the opening portion 25. Note that each of the base material exposed portions 215 is a portion where the base material 21 is exposed from the circuit pattern 22 at a position where the pair of electrodes 22a and 22b faces each other in the plan view. Because the second board 20 includes the base material exposed portions 215, even when the gap 15 between the lateral surface of the post portion 11 and the inner lateral surface of the opening portion 25 is narrow, contact between the post portion 11 and the circuit pattern 22 can be prevented. This makes it possible to improve the degree of freedom in design and facilitate the desired design of the circuit board 100. Even though the lateral surface of the second board 20 comes into contact with the lateral surface of the post portion 11, because an end portion of the base material exposed portion 215, that is an insulating body, exposed from the circuit pattern 22 comes into contact with the lateral surface of the post portion 11, the circuit pattern 22 does not come into contact with the lateral surface of the post portion 11. This makes it possible to prevent a short-circuit of the circuit board 100. Although the metal layer 23 is formed at the same position with respect to the circuit pattern 22 in the plan view, the metal layer 23 can be separated from the lateral surface of the post portion 11 by 100 μm or greater as compared with the circuit pattern 22. By increasing the distance between the metal layer 23 and the post portion 11, the possibility of contact between the metal layer 23 and the post portion 11 can be reduced and quality such as insulation withstand voltage characteristics can be stabilized.

A width W of the base material exposed portion 215 between an edge of the base material 21 and an edge of the circuit pattern 22 is preferably in a range from 50 μm to 200 μm. If the width W of the base material exposed portion 215 is 50 μm or greater, the effect of preventing contact between the post portion 11 and the circuit pattern 22 can be more reliably obtained. On the other hand, if the width W is 200 μm or less, a region for forming the circuit pattern 22 can be increased, so that a desired circuit pattern 22 is easily formed. Note that the width W of the base material exposed portion 215 is the shortest length at which the base material 21 is exposed from an end portion of the circuit pattern 22.

A distance D between the lateral surface of the post portion 11 and the lateral surface of the base material 21 facing the lateral surface of the post portion 11 is preferably in a range from 50 μm to 300 μm. If the distance D between the lateral surface of the post portion 11 and the lateral surface of the base material 21 is 50 μm or greater, the post portion 11 is easily inserted into the opening portion 25. On the other hand, if the distance D is 300 μm or less, the gap 15 can be made smaller, so that a foreign matter can be further suppressed from being mixed in the gap 15 when manufacturing the light emitting device 200. This makes it easier to protect the post portion 11. Note that, because the lateral surface of the post portion 11 is curved, the distance D is the shortest distance between the lateral surface of the base material 21 proximate to the opening portion 25 and the lateral surface of the post portion 11 at a portion facing the lateral surface of the base material 21.

In the circuit board 100, the entire top surface of the first board 10 excluding the post portion 11, that is, the entire top surface of the flat plate portion 12 faces the second surface 212 of the base material 21 in the second board 20. However, a part of the top surface of the flat plate portion 12 may face the second surface 212 of the base material 21 in the second board 20. In other words, there may be a portion where the second board 20 is not disposed on the top surface of the flat plate portion 12.

The circuit board 100 includes three electrodes with the post portion 11 as a central electrode together with the first electrode 22a and the second electrode 22b and can be used as a circuit board on which a light emitting component having a three-terminal structure is mounted, for example. Note that the circuit board 100 is described with one post portion 11 and one opening portion 25 due to restrictions on the drawing, but of course, a plurality of post portions 11 and a plurality of opening portions 25 may be present.

Light Emitting Device

Subsequently, a light emitting device will be described.

Figure 2A:
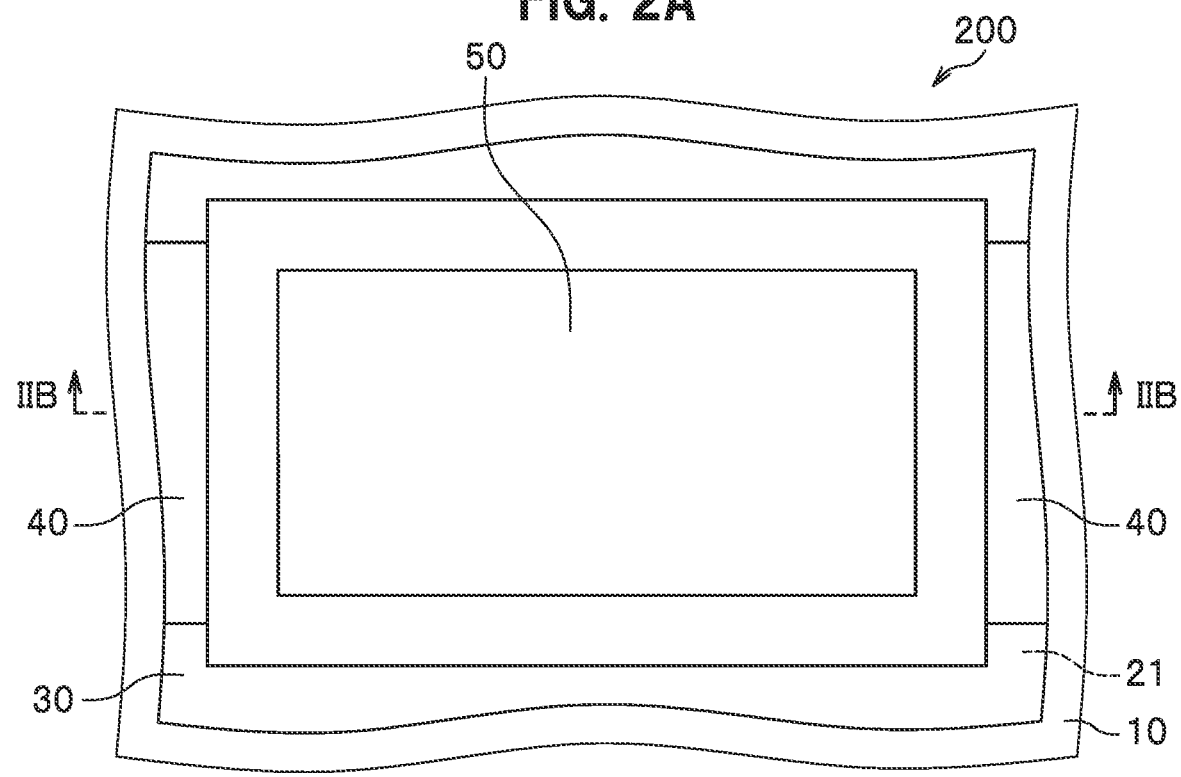
FIG. 2A is a plan view schematically illustrating an example of a light emitting device according to the embodiment.
Figure 2B:
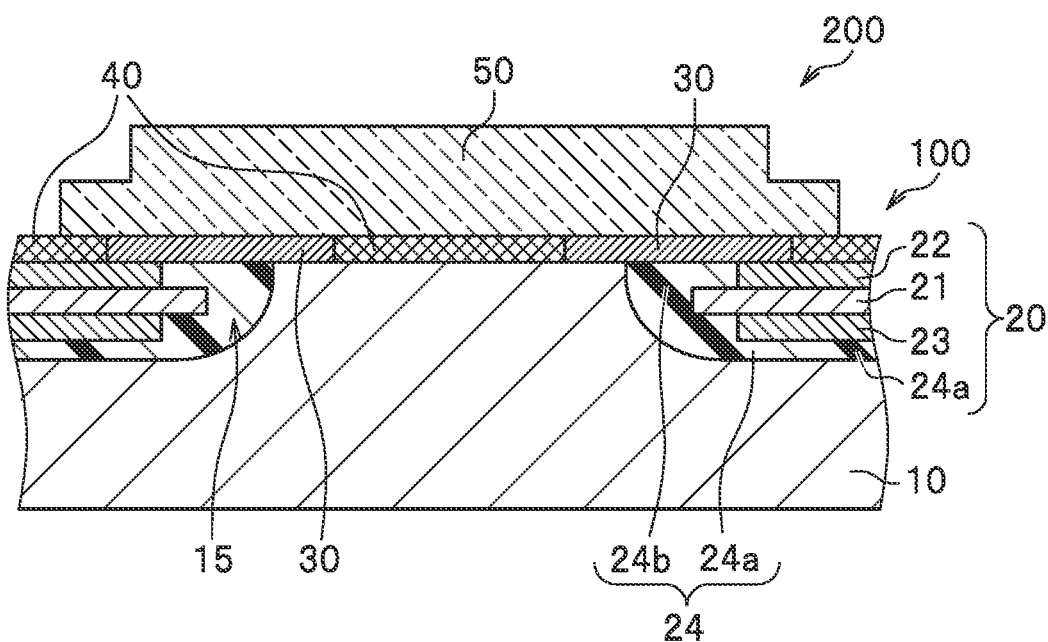
FIG. 2B is a schematic cross-sectional view taken along line IIB-IIB of FIG. 2A.

FIG. 2A is a plan view schematically illustrating an example of a light emitting device according to the embodiment. FIG. 2B is a schematic cross-sectional view taken along line IIB-IIB in FIG. 2A.

The light emitting device 200 includes the circuit board 100 described above and the light emitting component 50 placed on the post portion 11 of the circuit board 100.

The light emitting device 200 preferably includes at least the circuit board 100, a resist 30, a plating layer 40, and the light emitting component 50.

The circuit board 100 is configured as described above.

The resist 30 is insulating, for example, a solder resist. The resist 30 is provided on, for example, a portion other than a portion where the plating layer 40 is formed in the circuit board 100. The resist 30 is provided to cover, for example, the outer peripheral end portion of the top surface of the post portion 11 and the end portion of the top surface of the circuit pattern 22 proximate to the opening portion 25. As the resist 30, for example, a typical resist obtained by mixing a solvent, an anti-foaming agent, and the like with a copolymer resin such as epoxy, or a resist whitened by adding a filler such as titanium oxide can be used. On the other hand, in product design, when it is desired to suppress reflection, a black material with carbon added, or the like can be used.

The plating layer 40 is provided on the post portion 11 and on the circuit pattern 22 other than the portion where the resist 30 is provided, for example. As the plating layer 40, for example, Au, Ag, Cu, Pt, Ni, Pd, or an alloy containing one of these can be used. If the plating layer 40 is made of these materials, the reflectivity of light emitted from the light emitting component 50 to the circuit board 100 can be increased.

The light emitting component 50 is placed on the post portion 11, on the circuit pattern 22, and around the post portion 11 and the circuit pattern 22 of the circuit board 100 via the resist 30 and the plating layer 40. The light emitting component 50 is adhered to the circuit board 100 by, for example, an adhesive member such as a solder paste.

As the light emitting component 50, for example, a light emitting component in which a known light emitting element is placed on a substrate, a package, or the like can be used. Examples of the light emitting element include semiconductor laser elements, LED (Light Emitting Diode), organic electroluminescence elements, and the like. Furthermore, the light emitting component 50 may be a known light emitting element itself. That is, the light emitting device 200 may be a device in which a light emitting component including at least a light emitting element is placed on the circuit board 100 or a device in which a light emitting element is directly placed on the circuit board 100. The light emitting component 50 may have a configuration in which a plurality of post portions 11 are disposed in the circuit board 100 and a plurality of light emitting components 50 are connected to the plurality of corresponding post portions 11.

Method for Manufacturing Circuit Board

Subsequently, an example of a method for manufacturing the circuit board according to the embodiment will be described.

Figure 3:
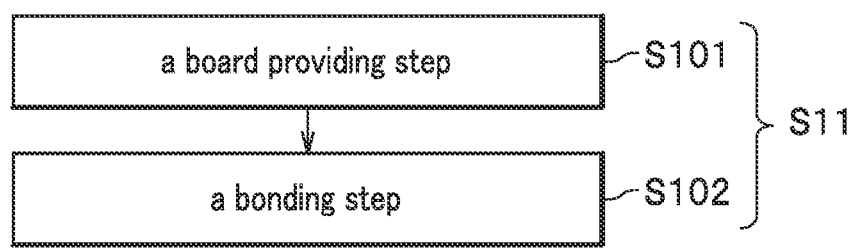
FIG. 3 is a flowchart illustrating a method for manufacturing the circuit board according to the embodiment.
Figure 4A:
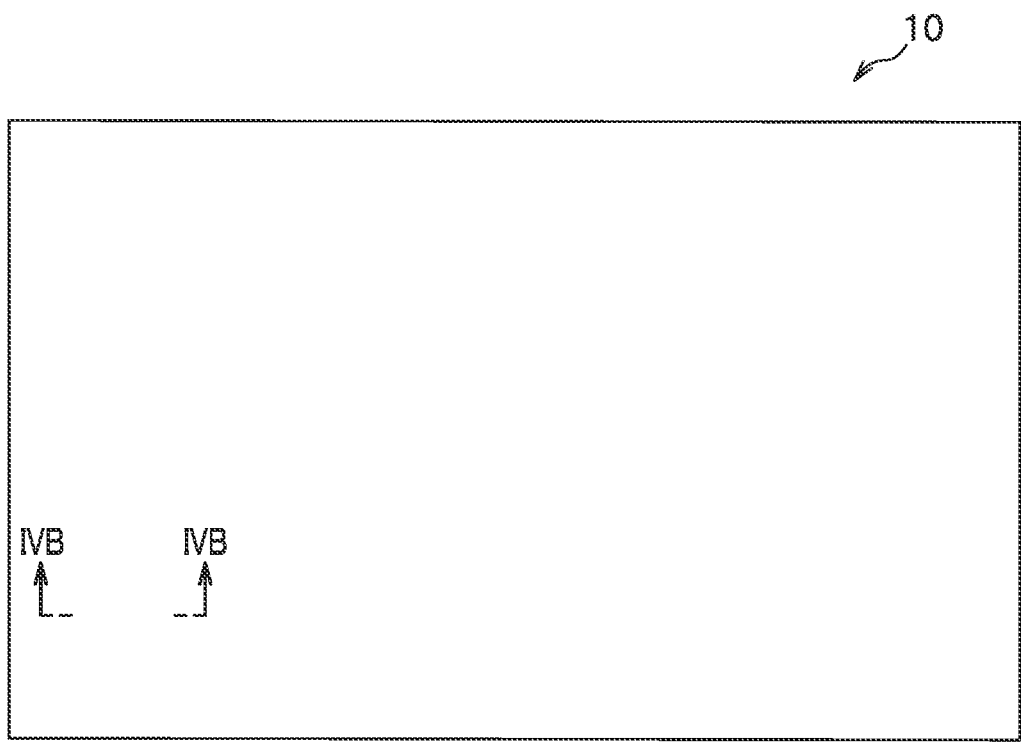
FIG. 4A is a plan view schematically illustrating a first board in a state of a flat plate before a post portion is formed in the method for manufacturing the circuit board according to the embodiment.
Figure 4B:
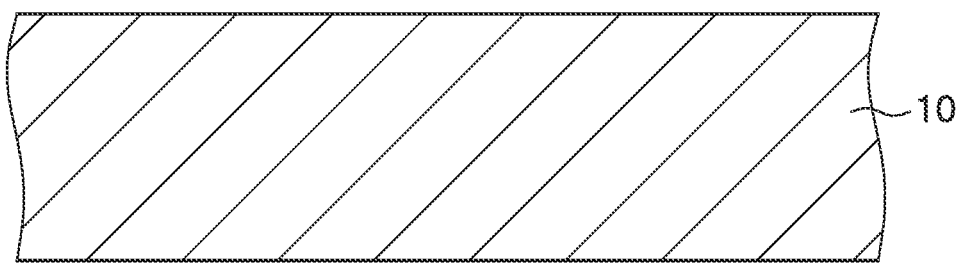
FIG. 4B is a schematic cross-sectional view taken along line IVB-IVB of FIG. 4A.
Figure 5A:
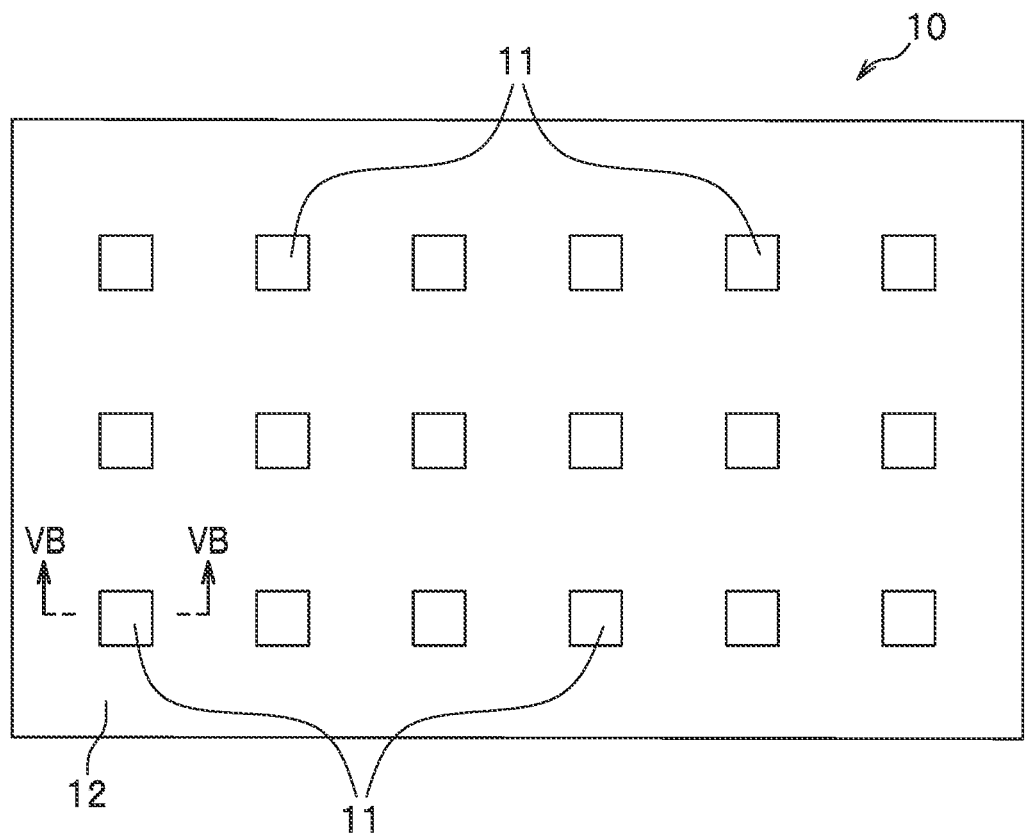
FIG. 5A is a plan view schematically illustrating the first board on which the post portion is formed in the method for manufacturing the circuit board according to the embodiment.
Figure 5B:
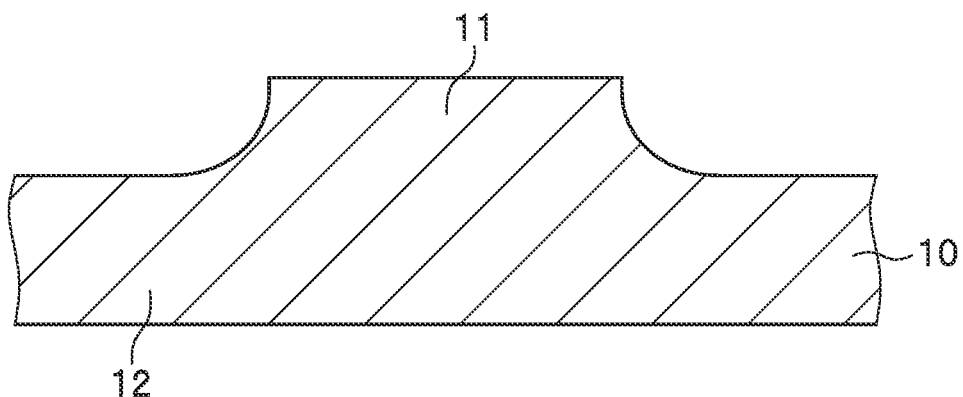
FIG. 5B is a schematic cross-sectional view taken along line VB-VB of FIG. 5A.
Figure 6A:
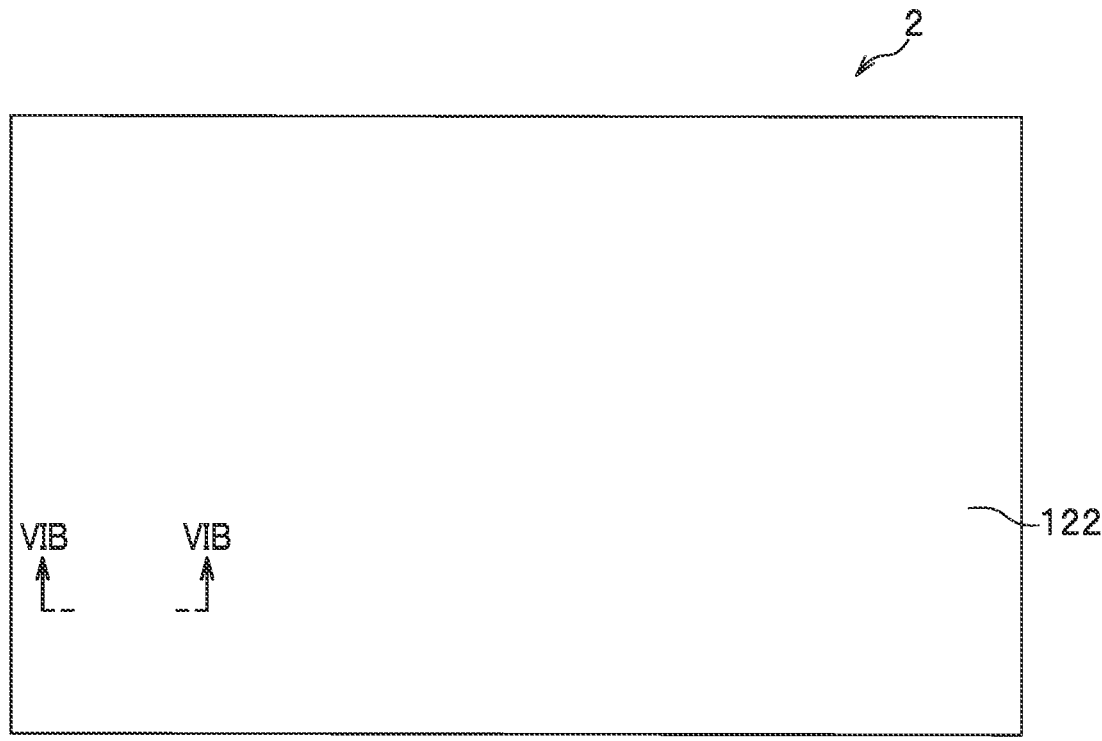
FIG. 6A is a plan view schematically illustrating a double-sided copper clad laminate in the method for manufacturing the circuit board according to the embodiment.
Figure 6B:
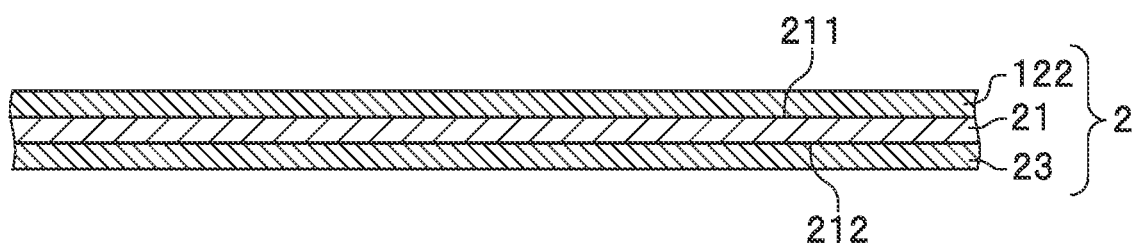
FIG. 6B is a schematic cross-sectional view taken along line VIB-VIB of FIG. 6A.
Figure 7A:
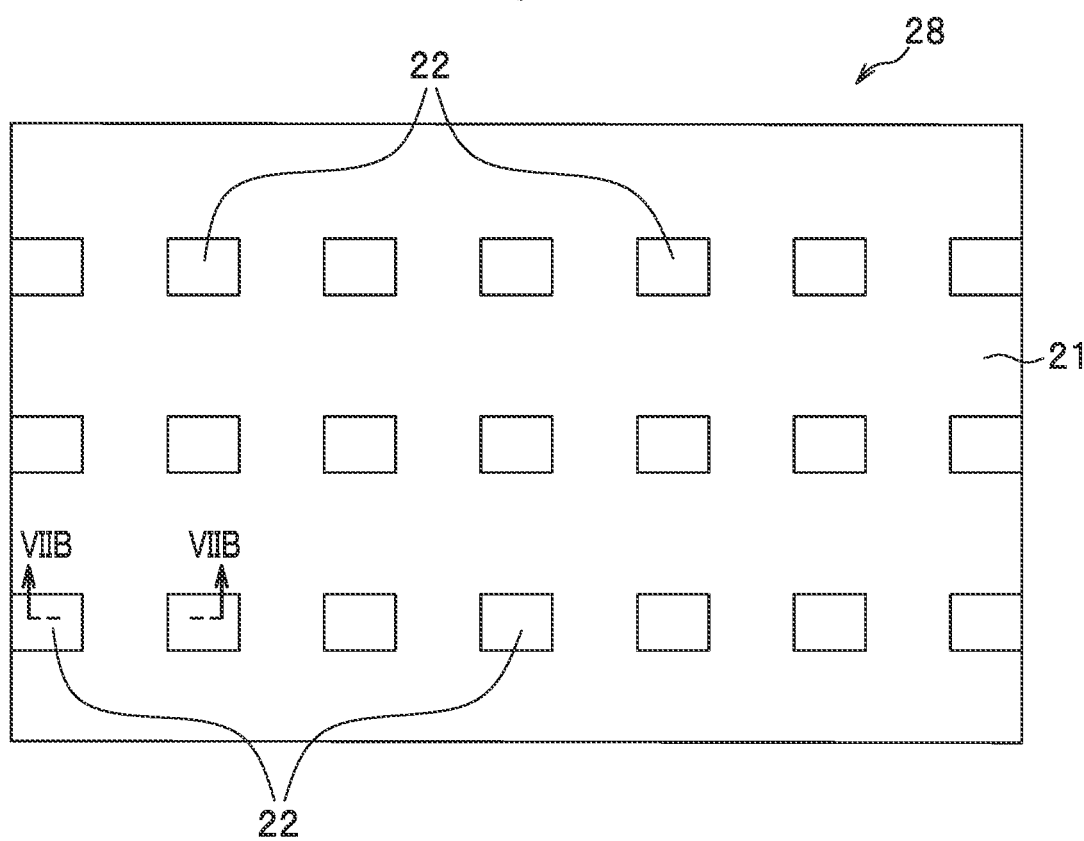
FIG. 7A is a plan view schematically illustrating a second board in which a circuit pattern is formed, and an adhesive member is disposed in the method for manufacturing the circuit board according to the embodiment.
Figure 7B:
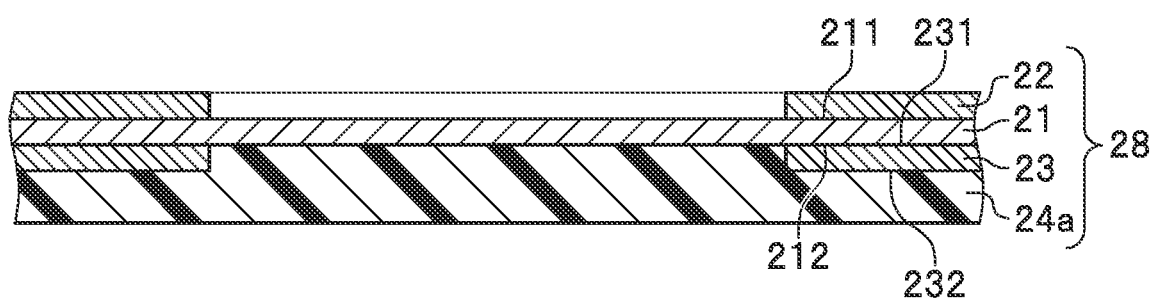
FIG. 7B is a schematic cross-sectional view taken along line VIIB-VIIB of FIG. 7A.
Figure 8A:
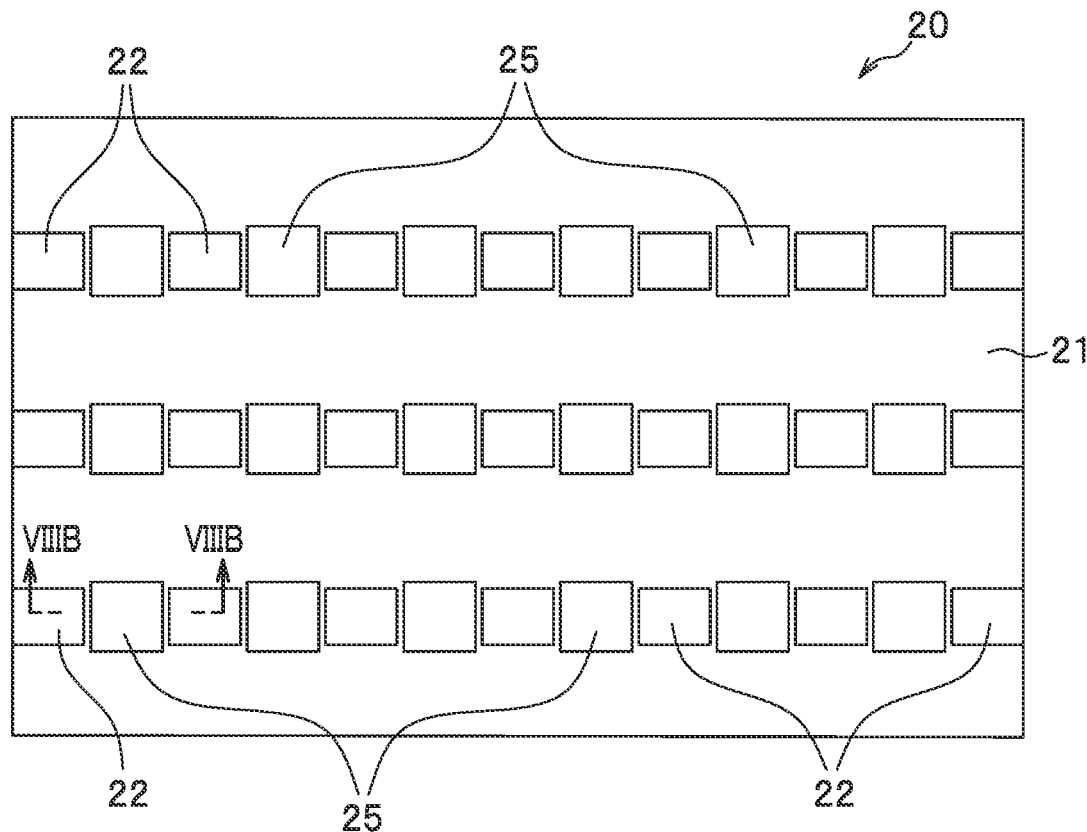
FIG. 8A is a plan view schematically illustrating the second board in which opening portions are formed in the method for manufacturing the circuit board according to the embodiment.
Figure 8B:
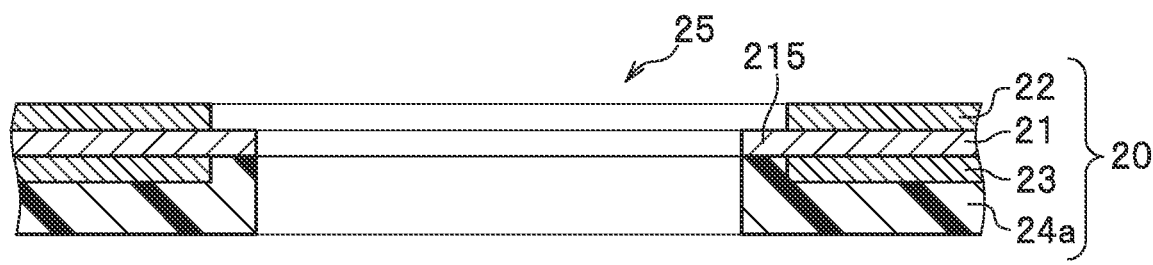
FIG. 8B is a schematic cross-sectional view taken along line VIIIB-VIIIB of FIG. 8A.
Figure 9A:
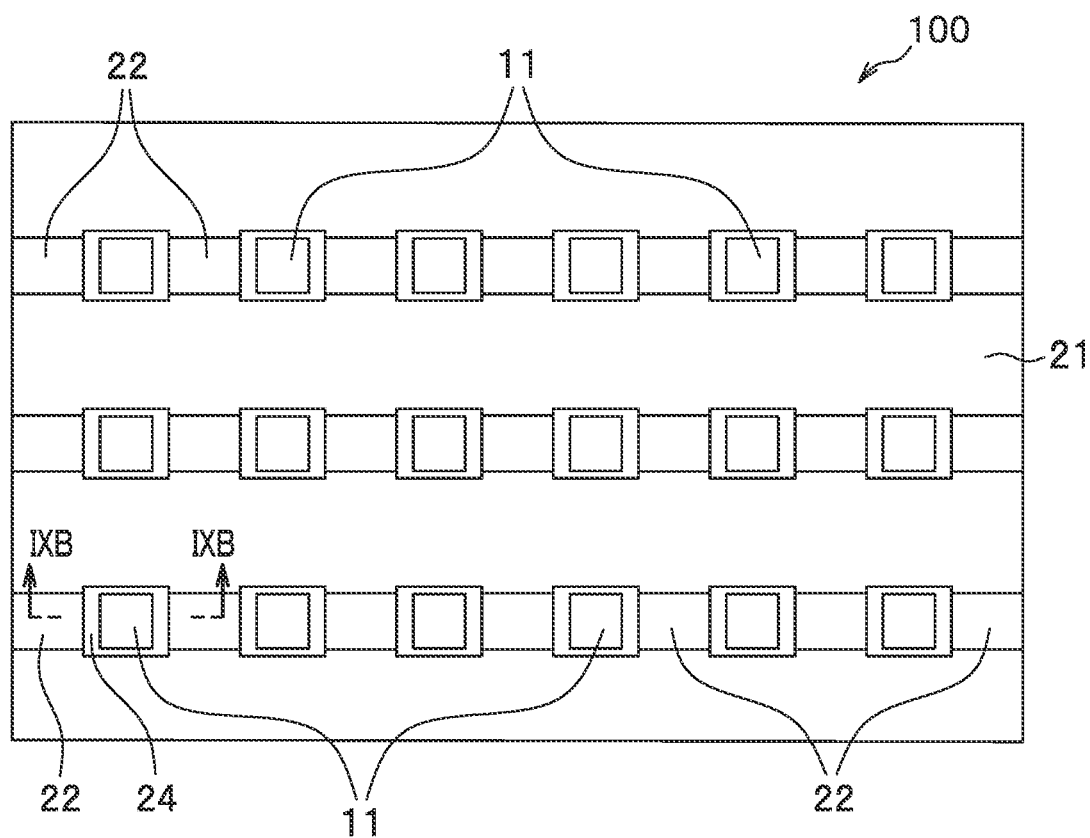
FIG. 9A is a plan view schematically illustrating a state in which the first board and the second board are bonded to each other in the method for manufacturing the circuit board according to the embodiment.
Figure 9B:
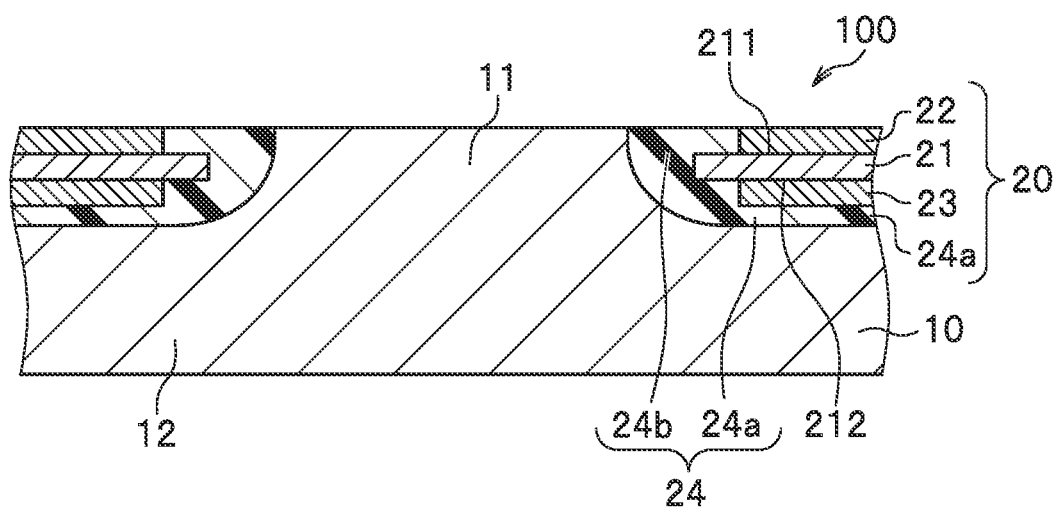
FIG. 9B is a schematic cross-sectional view taken along line IXB-IXB of FIG. 9A.

FIG. 3 is a flowchart illustrating a method for manufacturing the circuit board according to the embodiment. FIG. 4A is a plan view schematically illustrating the first board in a state of a flat plate before the post portion is formed in the method for manufacturing the circuit board according to the embodiment. FIG. 4B is a schematic cross-sectional view taken along line IVB-IVB of FIG. 4A. FIG. 5A is a plan view schematically illustrating the first board on which the post portion is formed in the method for manufacturing the circuit board according to the embodiment. FIG. 5B is a schematic cross-sectional view taken along line VB-VB of FIG. 5A. FIG. 6A is a plan view schematically illustrating a double-sided copper clad laminate in the method for manufacturing the circuit board according to the embodiment. FIG. 6B is a schematic cross-sectional view taken along line VIB-VIB of FIG. 6A. FIG. 7A is a plan view schematically illustrating the second board in which the circuit pattern is formed, and the adhesive member is disposed in the method for manufacturing the circuit board according to the embodiment. FIG. 7B is a schematic cross-sectional view taken along line VIIB-VIIB of FIG. 7A. FIG. 8A is a plan view schematically illustrating the second board in which the opening portions are formed in the method for manufacturing the circuit board according to the embodiment. FIG. 8B is a schematic cross-sectional view taken along line VIIIB-VIIIB of FIG. 8A. FIG. 9A is a plan view schematically illustrating a state in which the first board and the second board are bonded to each other in the method for manufacturing the circuit board according to the embodiment. FIG. 9B is a schematic cross-sectional view taken along line IXB-IXB of FIG. 9A.

Note that in the method for manufacturing the circuit board according to the embodiment, a plurality of circuit boards are manufactured simultaneously.

A method for manufacturing the circuit board 100 includes providing the first board 10 including the post portion 11 having a convex shape formed on a top surface of the first board and the second board 20 including the opening portion 25 formed through the base material 21 in a thickness direction. The base material 21 includes the circuit pattern 22 disposed on the first surface 211 and the adhesive member 24a disposed on the second surface 212 opposite to the first surface 211. The circuit pattern 22 includes the pair of electrodes 22a and 22b. The method further includes bonding the first board 10 and the second board 20 using the adhesive member 24 by pressurizing and heating the first board 10 and the second board 20 so that the top surface of the post portion 11 is exposed from the opening portion 25 and the top surface of the first board 10 excluding the post portion 11 and the second surface 212 of the base material 21 in the second board 20 face each other. In the plan view, the second board 20 includes the base material exposed portion 215 where the base material 21 protrudes in a direction toward the opening portion 25 further than the circuit pattern 22 and is exposed, and in the bonding, the adhesive member 24b melted by the pressurizing and the heating is disposed between the post portion 11 and the second board 20.

Specifically, the method for manufacturing the circuit board 100 includes a board providing step S101 and a bonding step S102.

Note that the material, arrangement, or the like of each of the members are as in the above description of the circuit board 100, and thus descriptions thereof will be omitted as appropriate.

Board Providing Step

The board providing step S101 is a step of providing the first board 10 and the second board 20.

In the board providing step S101, as a provision of the first board 10, for example, first, a copper plate is etched or pressed to manufacture the first board 10 in which the post portion 11 is formed.

In the board providing step S101, as a provision of the second board 20, for example, first, a commercially available double-sided copper clad laminate 2 is provided in which a copper foil, which is a metal layer 122 (first metal layer), is attached to the first surface 211 of the base material 21 and a copper foil, which is a metal layer 23 (second metal layer), is attached to the second surface 212 of the base material 21. Alternatively, the metal layer 23 may be joined to the second surface 212 of the base material 21 in a single-sided copper clad laminate in which the metal layer 122 is provided on the first surface 211 of the base material 21. Note that the metal layer 122 such as a copper foil may be joined to the first surface 211 of the base material 21 and the metal layer 23 such as a copper foil may be joined to the second surface 212 of the base material 21 without using a commercially available double-sided copper clad laminate or a commercially available single-sided copper clad laminate. Subsequently, a part of the metal layer 122 is removed by etching or the like and the circuit pattern 22 is formed such that the base material exposed portion 215 is formed after the opening portion 25 is formed. Furthermore, a part of the metal layer 23 is removed by etching or the like such that the base material exposed portion 215 is exposed from the metal layer 23. Subsequently, the adhesive member 24a is provided on the second surface 212 of the exposed base material 21 and the second surface 232 of the metal layer 23 to form a board 28 with an adhesive member. Subsequently, a hole opening process is performed at a desired position of the board 28 with an adhesive member to form the opening portion 25, and thus the second board 20 is provided. At this time, the position and size of the opening portion 25 are adjusted to form the base material exposed portion 215 exposed from the circuit pattern 22.

Note that in the board providing step S101, it is preferable to provide the first board and the second board having the preferred configurations described in the circuit board 100 above. For example, it is preferable to provide the first board and the second board such that the width W of the base material exposed portion 215, the distance D between the lateral surface of the post portion 11 and the lateral surface of the base material 21, the shape of the top surface of the post portion 11 in the plan view, the shape of the opening portion 25 in the plan view, and the like are as in the configurations described in the circuit board 100 above.

Bonding Step

The bonding step S102 is a step of bonding the first board 10 and the second board 20.

In the bonding step S102, for example, first, the top surface of the first board 10 and the second surface 212 of the base material 21 in the second board 20 are disposed to face each other via the adhesive member 24a such that the post portion 11 of the first board 10 is inserted in the opening portion 25 of the second board 20 and the top surface of the post portion 11 is exposed from the second board 20 in the opening portion 25. Subsequently, the adhesive member 24a is heated and pressurized by hot-pressing the second board 20 against the first board 10 and is made to flow, so that the adhesive member 24b is disposed between the post portion 11 and the second board 20. The arrangement of the adhesive member 24b between the post portion 11 and the second board 20 due to the flow of the adhesive member 24a can be controlled by the amount of solvent added to the adhesive member 24a, conditions of the pressurization and the heating, and the like. The amount of the solvent is preferably in a range from 1 part by mass to 10 parts by mass with respect to 100 parts by mass of the adhesive member. Examples of the solvent that can be used include esters solvents, ketones solvents, aromatic hydrocarbons solvents, and the like. The pressure during the pressurization is preferably in a range from 1 MPa to 6 MPa, for example. The heating temperature is preferably in a range from 150° C. to 200° C., for example. Subsequently, the adhesive member 24 is cured. When the first board 10 and the second board 20 are bonded to each other, it is preferable to treat the first board 10 and the second board 20 in a vacuum container. This makes it possible to inhibit the generation of air bubbles between the first board 10 and the second board 20 and to stabilize the adhesion property. Furthermore, in order to improve the adhesion property between the first board 10 and the second board 20, the surface of the first board 10 may be further etched with hydrogen peroxide or the like, or roughened by wet blasting or the like.

In the bonding step S102, the first board 10 and the second board 20 may be bonded to each other such that the top surface of the post portion 11, the top surface of the adhesive member 24b disposed between the post portion 11 and the second board 20, and the top surface of the circuit pattern 22 are flush with each other. In order to make these top surfaces flush with each other, for example, the thickness of the flat plate portion 12 and the height of the post portion 11 of the first board 10, and the thickness of the base material 21, the thickness of the circuit pattern 22, the thickness of the metal layer 23, the thickness of the adhesive member 24a, and the like of the second board 20 may be adjusted, and the heating and pressurizing conditions may be adjusted. Furthermore, a SUS plate and the like can also be disposed on the top surface of the post portion 11 to make the heights of the post portion 11 and the second board 20 uniform.

Note that in the method for manufacturing the circuit board according to the embodiment, the plurality of circuit boards 100 are manufactured simultaneously, but an aggregate of the circuit boards 100 may be individualized into each circuit board 100, or the aggregate of the circuit boards 100 may be left as it is and may be shifted to the method for manufacturing the light emitting device 200 to be described below. Moreover, it is preferable to cover the surfaces of the post portion 11 and the circuit pattern 22 with a film material having a mold release property during heat pressing such that the adhesive member 24b does not exude. Examples of the film material that can be used include a heat-resistant material such as polyethylene terephthalate (PET), polyimide, or fluororesin. Examples of the mold release material that can be used include a typical mold release treatment agent such as silicone. Furthermore, after the bonding step is ended, a removing step may be performed such that the post portion 11 is not covered with the adhesive member 24b and the top surface of the post portion 11 is always exposed.

The circuit board 100 manufactured in this way has the following superior effects as compared to the related art. For example, as in the related art, when the circuit pattern is provided at the end portion of the base material of the wiring board proximate to the opening portion, the post portion and the circuit pattern may come into contact with each other when the copper plate and the wiring board are bonded to each other. For that reason, the circuit board may be short-circuited. On the other hand, the method for manufacturing the circuit board according to the present embodiment can prevent contact between the post portion 11 and the circuit pattern 22 because the second board 20 includes the base material exposed portion 215 even when the gap 15 between the lateral surface of the post portion 11 and the inner lateral surface of the opening portion 25 is narrow. This makes it possible to improve the degree of freedom in design and facilitate the desired design of the circuit board 100. Even though the lateral surface of the second board 20 comes into contact with the lateral surface of the post portion 11, because an end portion of the base material exposed portion 215 exposed from the circuit pattern 22 comes into contact with the lateral surface of the post portion 11, the circuit pattern 22 does not come into contact with the lateral surface of the post portion 11. This makes it possible to prevent a short-circuit of the circuit board 100.

Method for Manufacturing Light Emitting Device

Subsequently, an example of a method for manufacturing the light emitting device according to the embodiment will be described.

Figure 10:
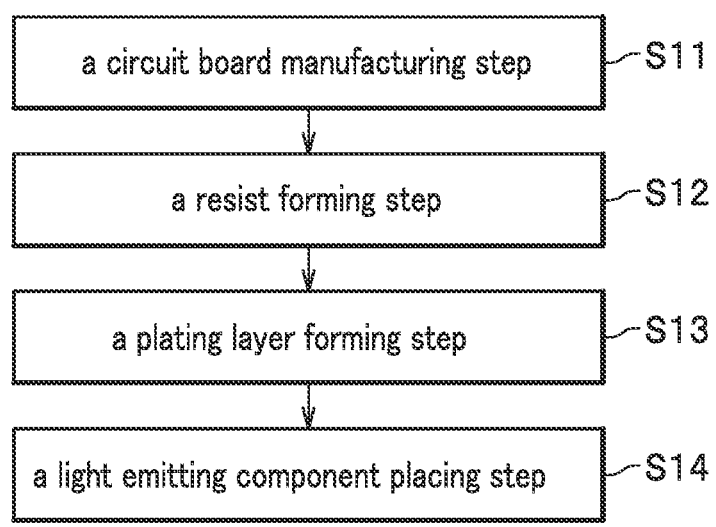
FIG. 10 is a flowchart illustrating a method for manufacturing a light emitting device according to the embodiment.
Figure 11A:
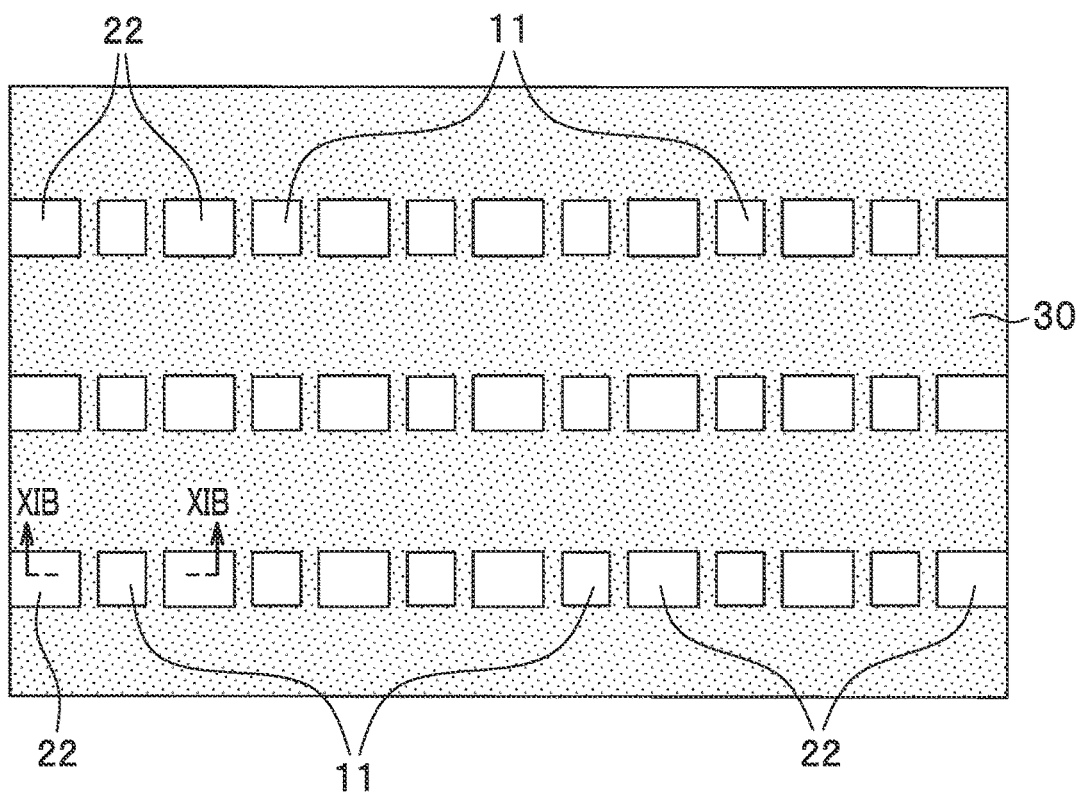
FIG. 11A is a plan view schematically illustrating a state in which a resist is formed in the method for manufacturing the light emitting device according to the embodiment.
Figure 11B:
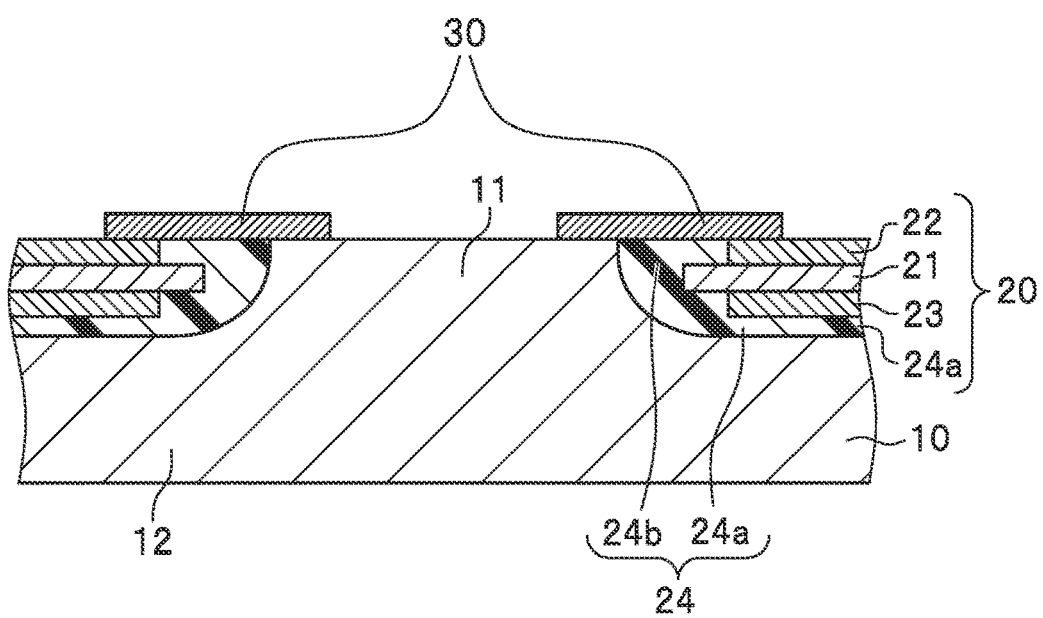
FIG. 11B is a schematic cross-sectional view taken along line XIB-XIB in FIG. 11A.
Figure 12A:
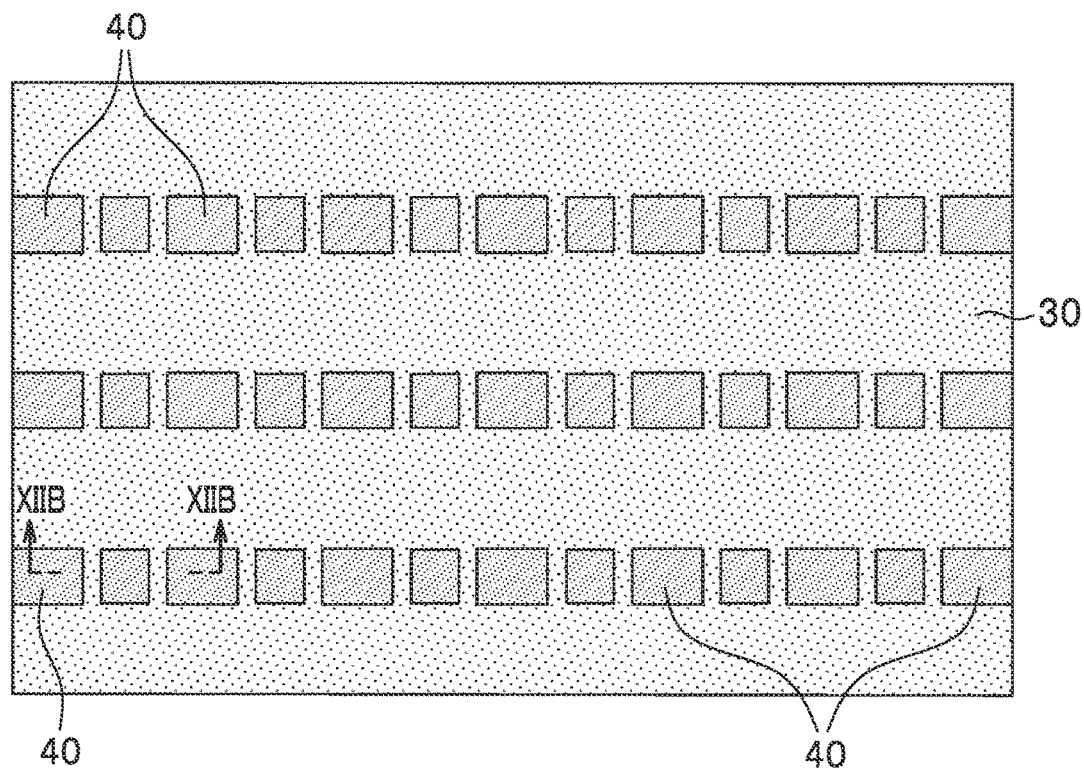
FIG. 12A is a plan view schematically illustrating a state in which a plating layer is formed in the method for manufacturing the light emitting device according to the embodiment.
Figure 12B:
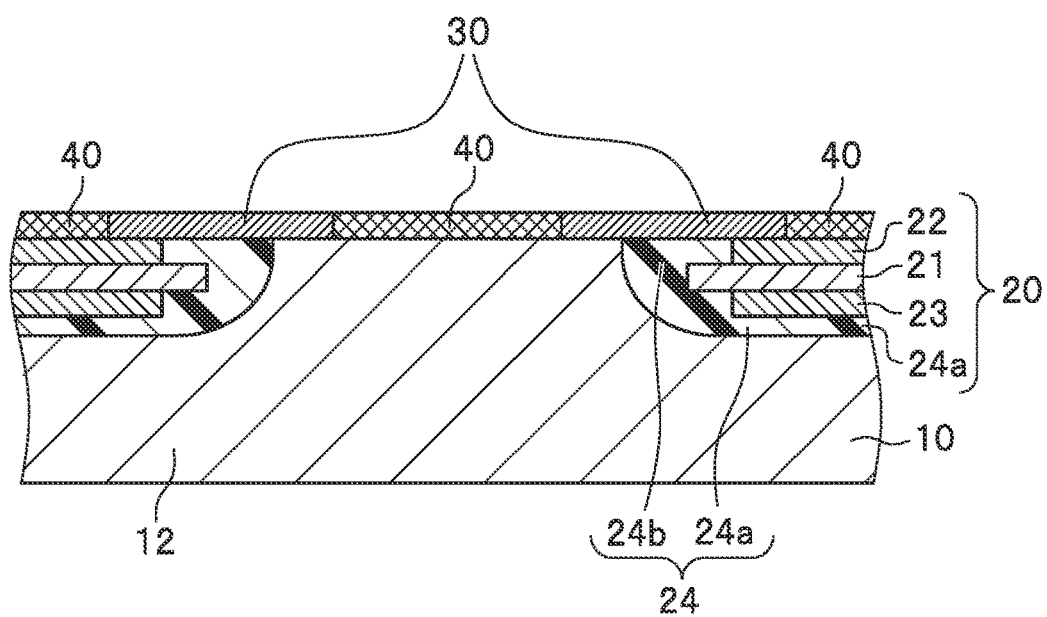
FIG. 12B is a schematic cross-sectional view taken along line XIIB-XIIB of FIG. 12A.
Figure 13A:
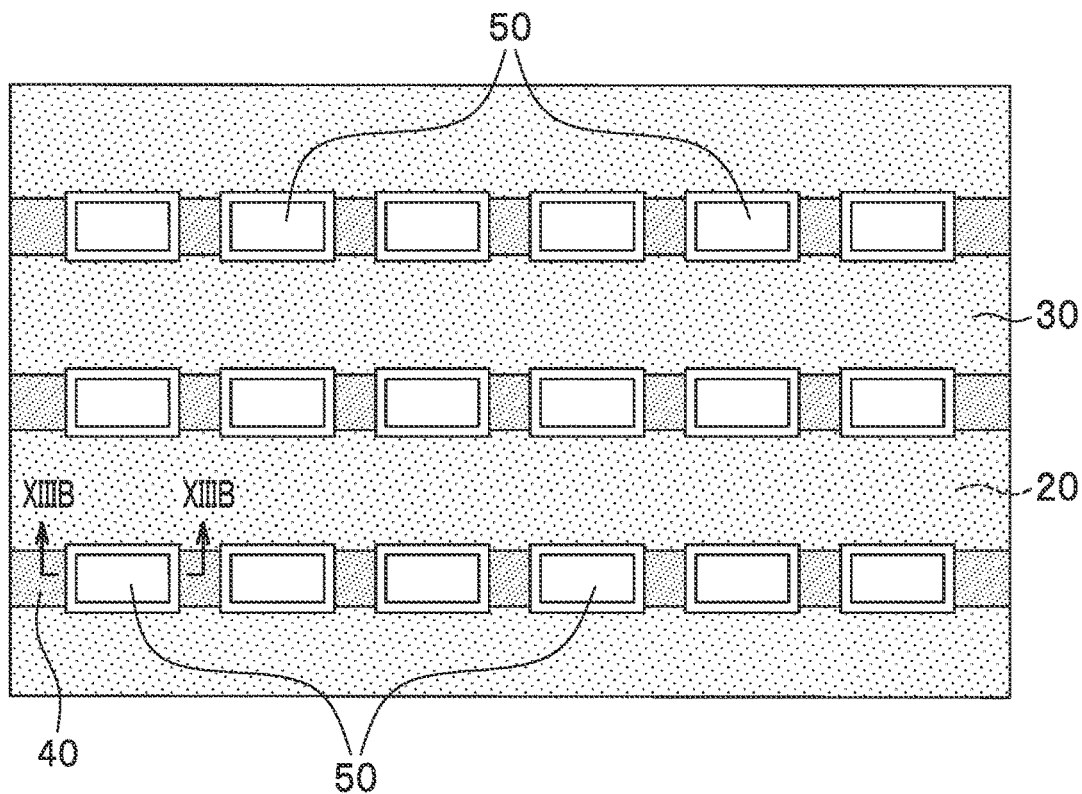
FIG. 13A is a plan view schematically illustrating a state in which a light emitting component is placed on the circuit board in the method for manufacturing the light emitting device according to the embodiment.
Figure 13B:
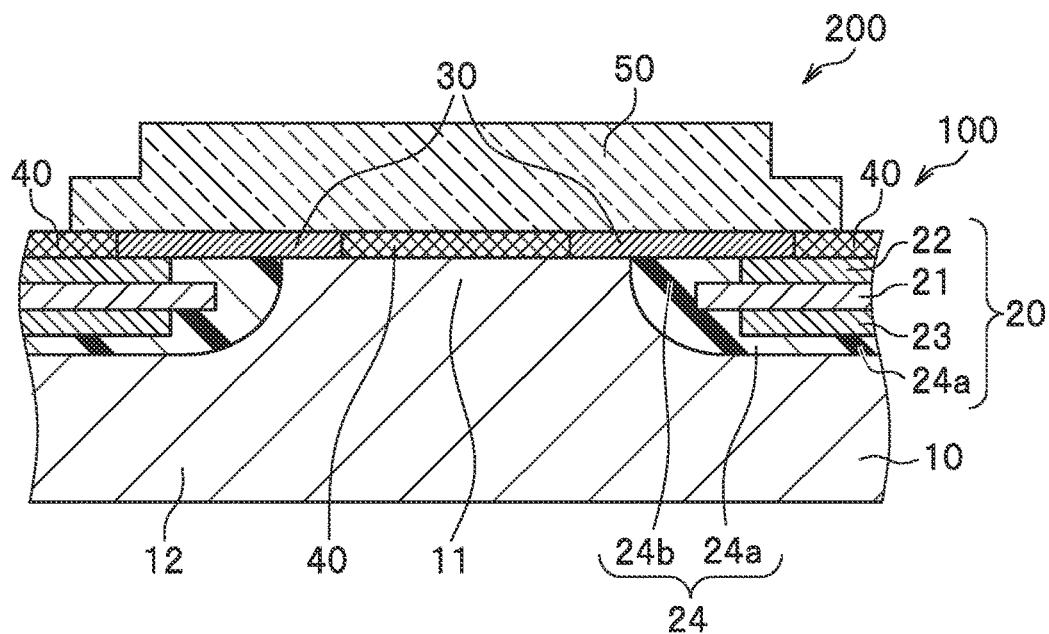
FIG. 13B is a schematic cross-sectional view taken along line XIIIB-XIIIB of FIG. 13A.

FIG. 10 is a flowchart illustrating the method for manufacturing the light emitting device according to the embodiment. FIG. 11A is a plan view schematically illustrating a state in which a resist is formed in the method for manufacturing the light emitting device according to the embodiment. FIG. 11B is a schematic cross-sectional view taken along line XIB-XIB of FIG. 11A. FIG. 12A is a plan view schematically illustrating a state in which a plating layer is formed in the method for manufacturing the light emitting device according to the embodiment. FIG. 12B is a schematic cross-sectional view taken along line XIIB-XIIB of FIG. 12A. FIG. 13A is a plan view schematically illustrating a state in which a light emitting component is placed on the circuit board in the method for manufacturing the light emitting device according to the embodiment. FIG. 13B is a schematic cross-sectional view taken along line XIIIB-XIIIB of FIG. 13A.

The method for manufacturing the light emitting device includes a step of manufacturing the circuit board 100 by the above-described method for manufacturing the circuit board, and a step of placing the light emitting component 50 on the post portion 11 of the circuit board 100.

Specifically, the method for manufacturing the light emitting device includes a circuit board manufacturing step S11, a resist forming step S12, a plating layer forming step S13, and a light emitting component placing step S14.

Note that the material, arrangement, or the like of each of the members are as in the above description of the light emitting device 200, and thus descriptions thereof will be omitted as appropriate.

Circuit Board Manufacturing Step

The circuit board manufacturing step S11 is a step of manufacturing the circuit board 100 by the above-described method for manufacturing the circuit board. In the circuit board manufacturing step S11, the circuit board 100 is manufactured by performing the above-described board providing step S101 and bonding step S102.

Resist Forming Step

The resist forming step S12 is a step of forming the resist 30 on the top surface of the circuit board 100. The formation of the resist 30 can be performed by, for example, a screen printing method using a screen mask. Furthermore, if more accuracy is required for the resist 30, the resist 30 can be formed by a step of exposure and development using a photosensitive resist material.

Plating Layer Forming Step

The plating layer forming step S13 is a step of forming the plating layer 40 on the top surface of the circuit board 100. The plating layer 40 is usually formed by electroless Ni/Au plating but can be formed by performing electroless Ni/Pd/Au plating or electrolytic Ni/Au plating.

Light Emitting Component Placing Step

The light emitting component placing step S14 is a step of placing the light emitting component 50 on the circuit board 100.

In the light emitting component placing step S14, for example, the light emitting component 50 is placed on the post portion 11, on the circuit pattern 22, and around the post portion 11 and the circuit pattern 22 of the circuit board 100 via the resist 30 and the plating layer 40 by using an adhesive member such as solder paste.

In this manner, an aggregate of the light emitting devices 200 is manufactured. The aggregate is then individualized into each light emitting device 200 to obtain a plurality of the light emitting devices 200.

Although the embodiments for carrying out the invention have been described above in more detail, the gist of the present invention is not limited to these descriptions and must be broadly interpreted based on the description of the scope of claims. Various modifications, variations, and the like based on these descriptions are also included within the spirit of the present invention.

Hereinafter, modification examples and application examples will be described. Note that the material, arrangement, or the like of each of the members are as in the description of the embodiment, and thus descriptions thereof will be omitted as appropriate. Hereinafter, a part mainly different from the embodiment will be described.

MODIFICATION EXAMPLES

Modification Example 1

Figure 14A:
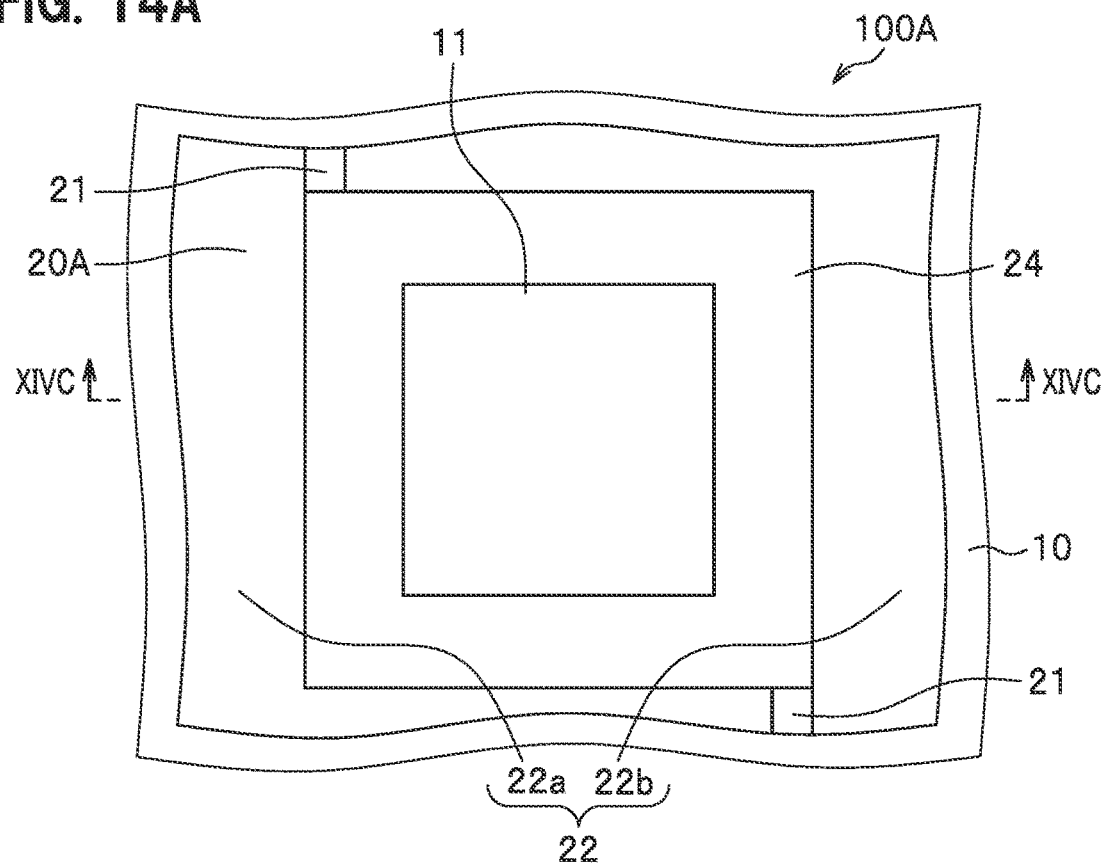
FIG. 14A is a plan view schematically illustrating an example of a circuit board according to a modification example 1.
Figure 14B:
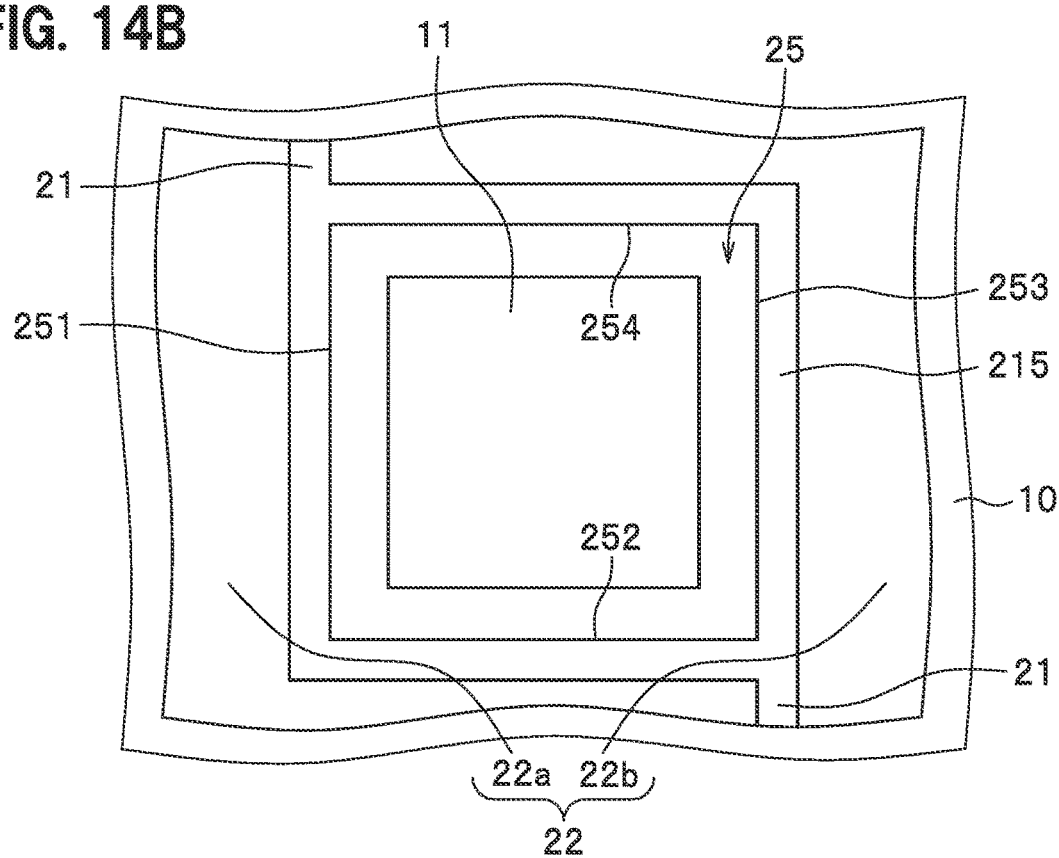
FIG. 14B is a plan view in which an adhesive member is removed in FIG. 14A.
Figure 14C:
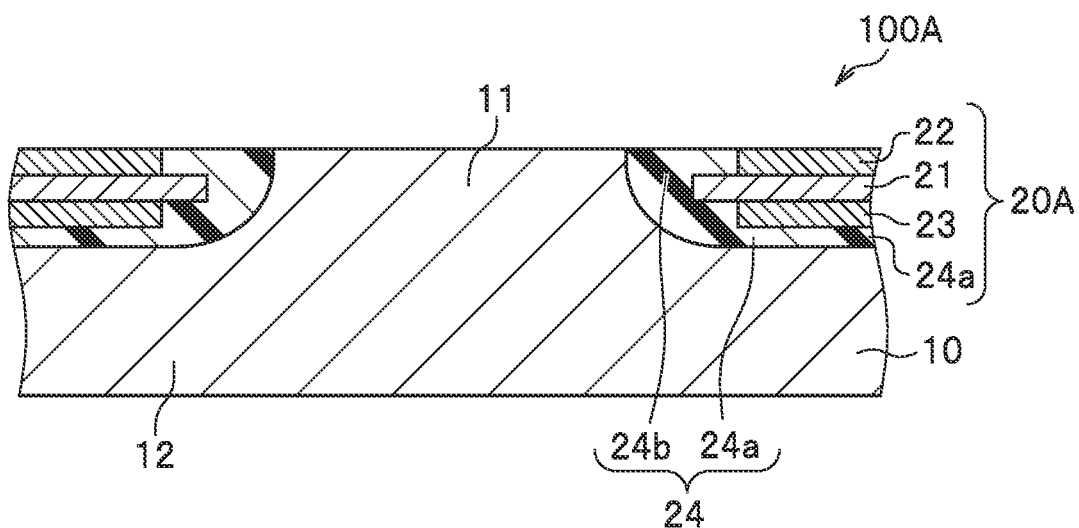
FIG. 14C is a schematic cross-sectional view taken along line XIVC-XIVC of FIG. 14A.
Figure 14D:
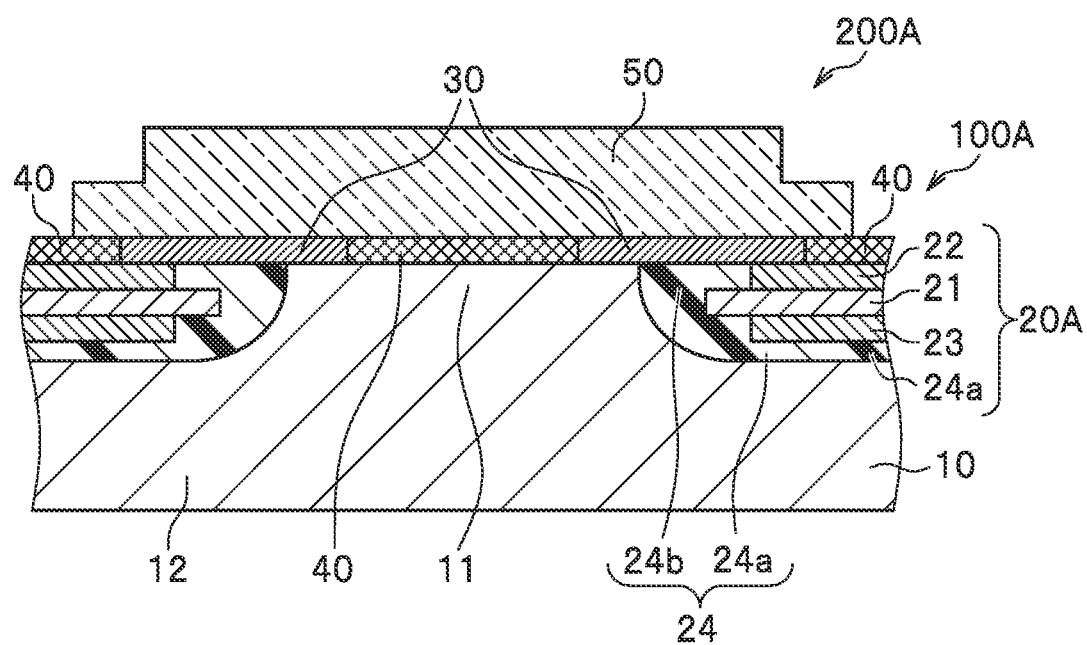
FIG. 14D is a cross-sectional view schematically illustrating an example of a light emitting device according to the modification example 1.

FIG. 14A is a plan view schematically illustrating an example of a circuit board according to a modification example 1. FIG. 14B is a plan view in which an adhesive member is removed in FIG. 14A. FIG. 14C is a schematic cross-sectional view taken along line XIVC-XIVC of FIG. 14A. FIG. 14D is a cross-sectional view schematically illustrating an example of a light emitting device according to the modification example 1.

In a circuit board 100A and a light emitting device 200A, the base material exposed portion 215 of a second board 20A is formed proximate to the opening portion 25 so as to surround the periphery of the post portion 11 in the plan view.

Specifically, in the plan view, the opening portion 25 has a quadrangular shape, and the first electrode 22a is formed along a first side 251 of the quadrangular shape and a second side 252 orthogonal to the first side 251. Furthermore, the second electrode 22b is formed along a third side 253 facing the first side 251 and a fourth side 254 orthogonal to the third side 253 and facing the second side 252. The second board 20A includes, around the opening portion 25, the base material exposed portion 215 in which the base material 21 proximate to the opening portion 25 is exposed from the circuit pattern 22. Moreover, in the plan view, the base material exposed portion 215 extends along the first side 251 of the quadrangular shape to an end portion of the second board 20A proximate to the fourth side 254 of the quadrangular shape. Furthermore, in the plan view, the base material exposed portion 215 extends along the third side 253 of the quadrangular shape to an end portion of the second board 20A proximate to the second side 252 of the quadrangular shape. The first electrode 22a and the second electrode 22b are partitioned. In the plan view, the adhesive member 24 covers the base material exposed portion 215 surrounding the periphery of the post portion 11, preferably 80% or greater, more preferably 95% or greater.

With such a configuration, even though the flow of the adhesive member 24 is large, the adhesive member 24 is blocked by the circuit pattern 22 around the post portion 11, so that the adhesive member 24 can be prevented from flowing out to the surface of the circuit pattern 22. For that reason, the surface of the circuit board 100A can be prevented from being soiled by the adhesive member 24.

In order to obtain such a configuration, the second board 20A may be provided in the board providing step.

Modification Example 2

Figure 15A:
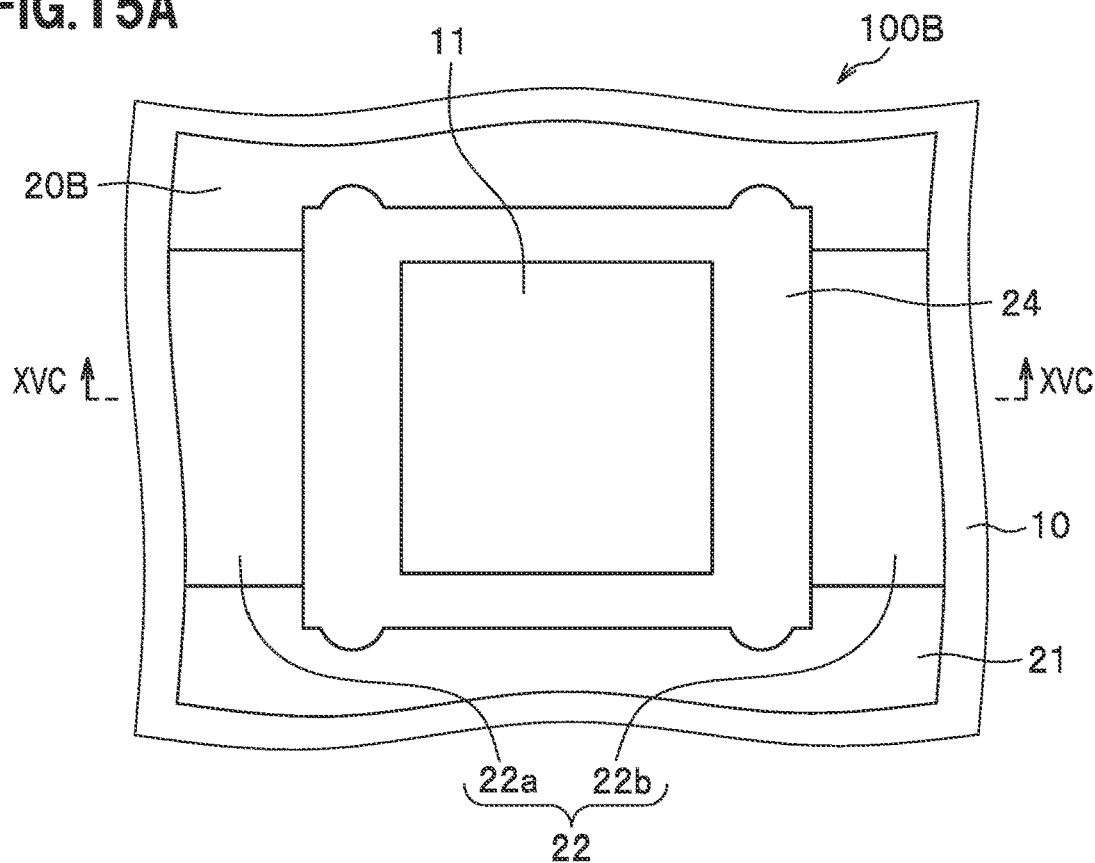
FIG. 15A is a plan view schematically illustrating an example of a circuit board according to a modification example 2.
Figure 15B:
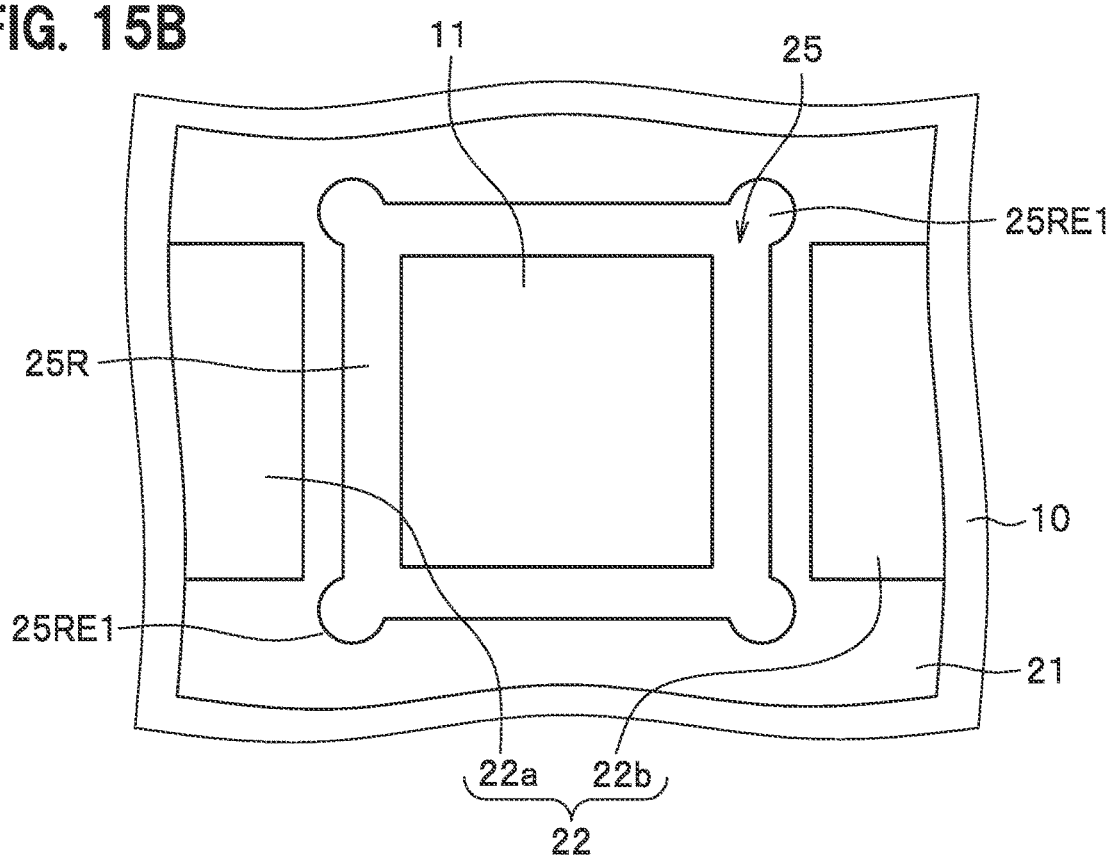
FIG. 15B is a plan view in which an adhesive member is removed in FIG. 15A.
Figure 15C:
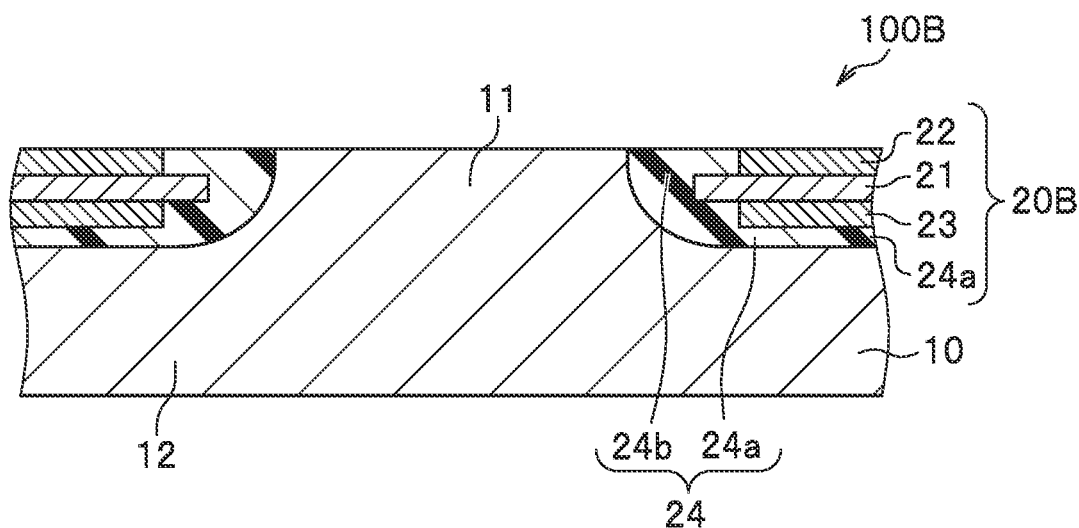
FIG. 15C is a schematic cross-sectional view taken along line XVC-XVC of FIG. 15A.
Figure 15D:
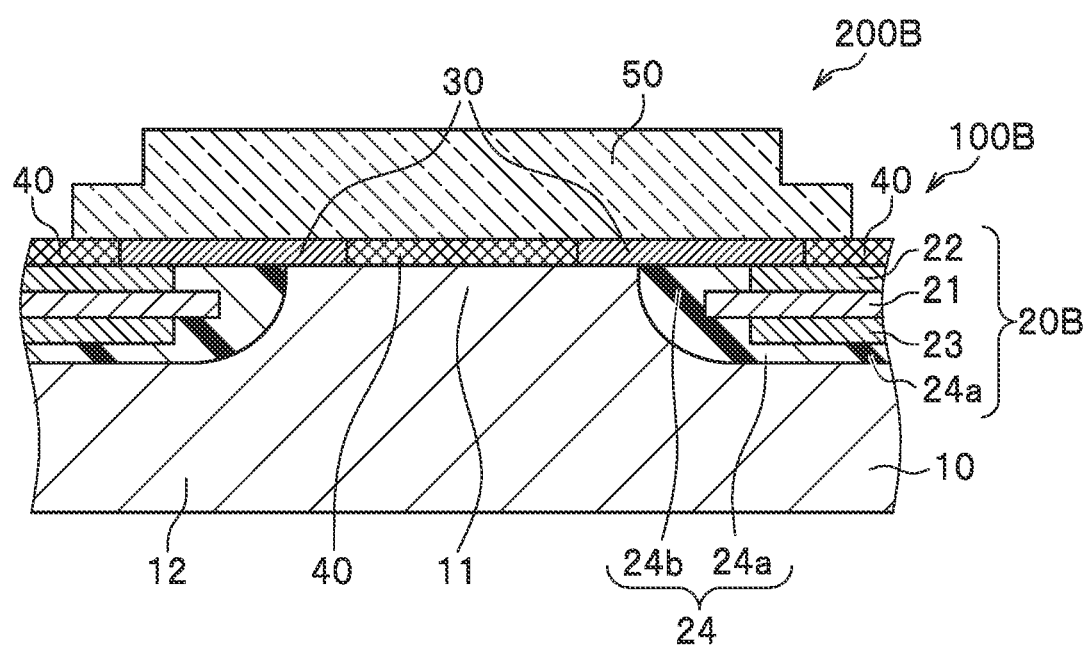
FIG. 15D is a cross-sectional view schematically illustrating an example of a light emitting device according to the modification example 2.

FIG. 15A is a plan view schematically illustrating an example of a circuit board according to a modification example 2. FIG. 15B is a plan view in which an adhesive member is removed in FIG. 15A. FIG. 15C is a schematic cross-sectional view taken along line XVC-XVC of FIG. 15A. FIG. 15D is a cross-sectional view schematically illustrating an example of a light emitting device according to the modification example 2.

In a circuit board 100B and a light emitting device 200B, the opening portion 25 of a second board 20B has a substantially quadrangular shape in the plan view and includes, at four corners of the substantially quadrangular shape, opening extension regions 25RE1 that partially expand an opening region 25R (opening area) of the opening portion 25 outward, and the opening extension region 25RE1 is formed with an arc shape outline. In the plan view, the adhesive member 24 is disposed to surround the periphery of the post portion 11 and is disposed in each opening extension region 25RE1.

The "substantially quadrangular shape" means a shape similar to a quadrangle and means a quadrangular shape when four corners of the substantially quadrangular shape are right angles in the modification example 2. In the modification example 2, because the four corners are not right angles and the opening extension region 25RE1 has an arc shape outline, the opening portion 25 is formed with an arc shape outline at the four corners.

With such a configuration, the adhesive member 24 is likely to flow into the opening portion 25 via the opening extension regions 25RE1 and is likely to be disposed in the opening portion 25. For example, even if a slight position shift occurs when the first board 10 and the second board 20B are bonded to each other, the adhesive member 24 is likely to be disposed in the opening portion 25 via the opening extension regions 25RE1.

In order to obtain such a configuration, the second board 20B may be provided in the board providing step.

Modification Example 3

Figure 16A:
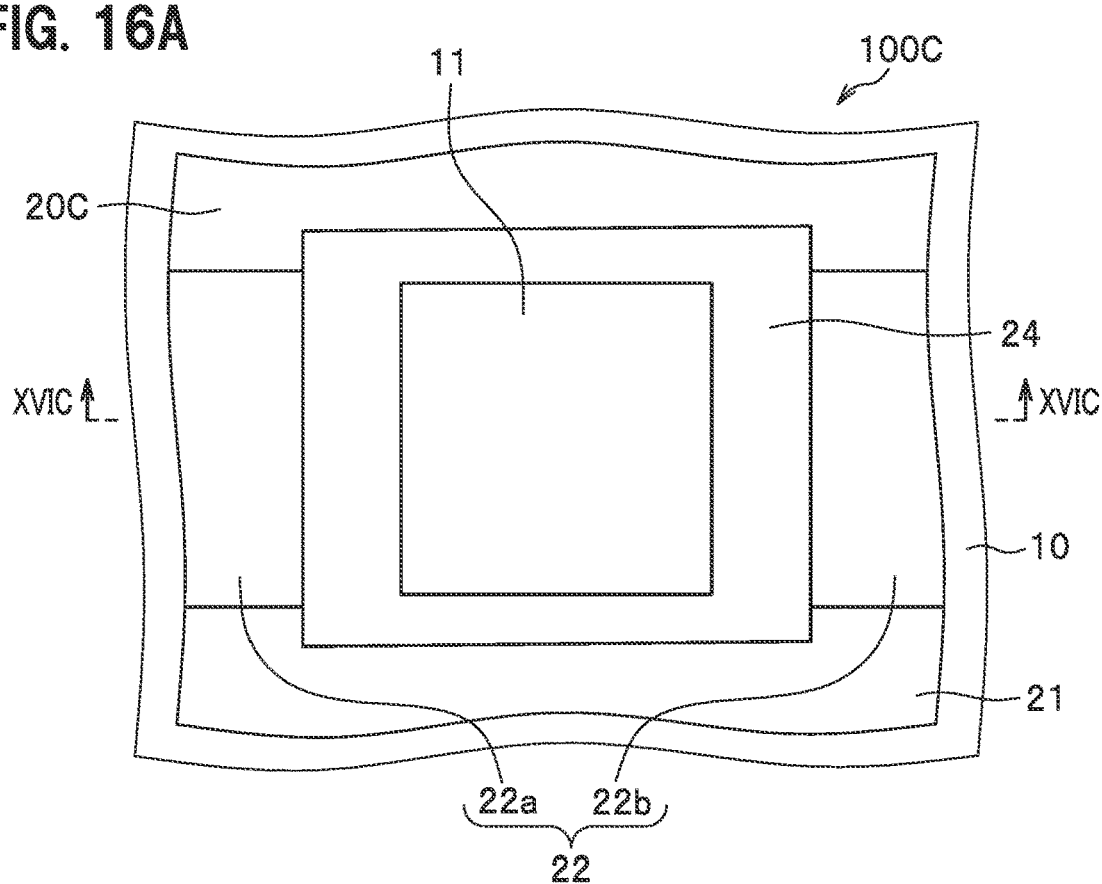
FIG. 16A is a plan view schematically illustrating an example of a circuit board according to a modification example 3.
Figure 16B:
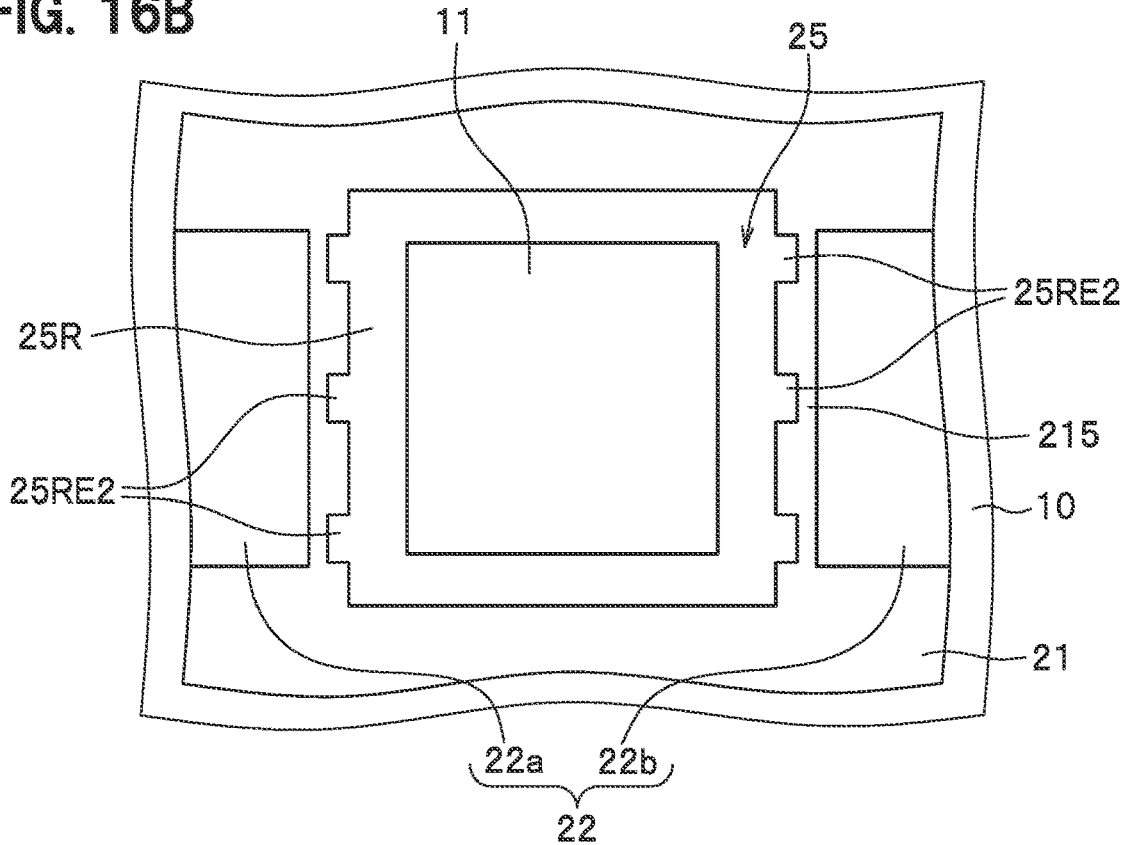
FIG. 16B is a plan view in which an adhesive member is removed in FIG. 16A.
Figure 16C:
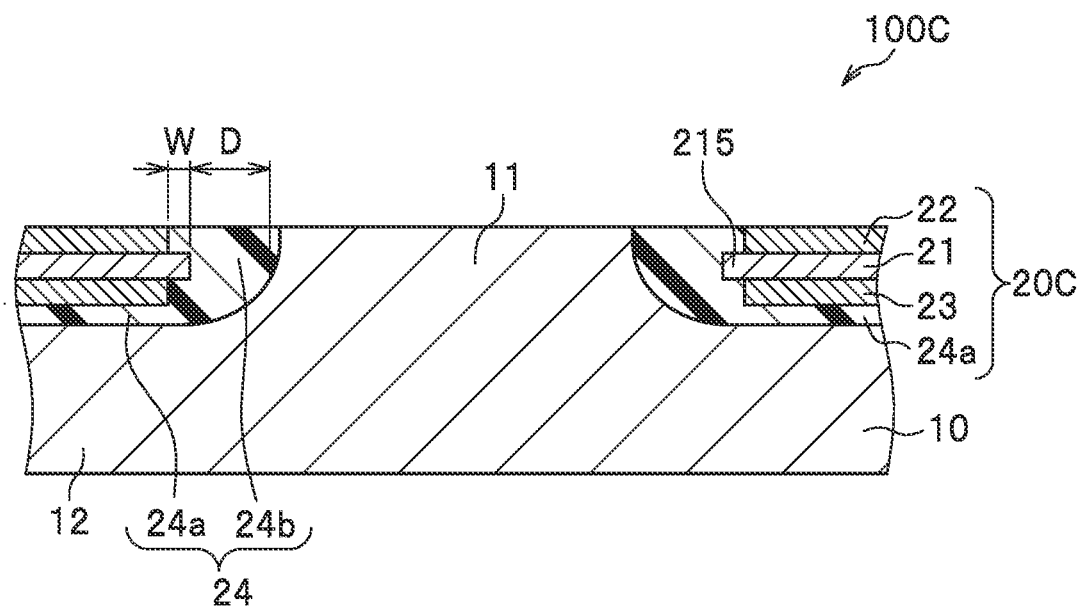
FIG. 16C is a schematic cross-sectional view taken along line XVIC-XVIC of FIG. 16A.
Figure 16D:
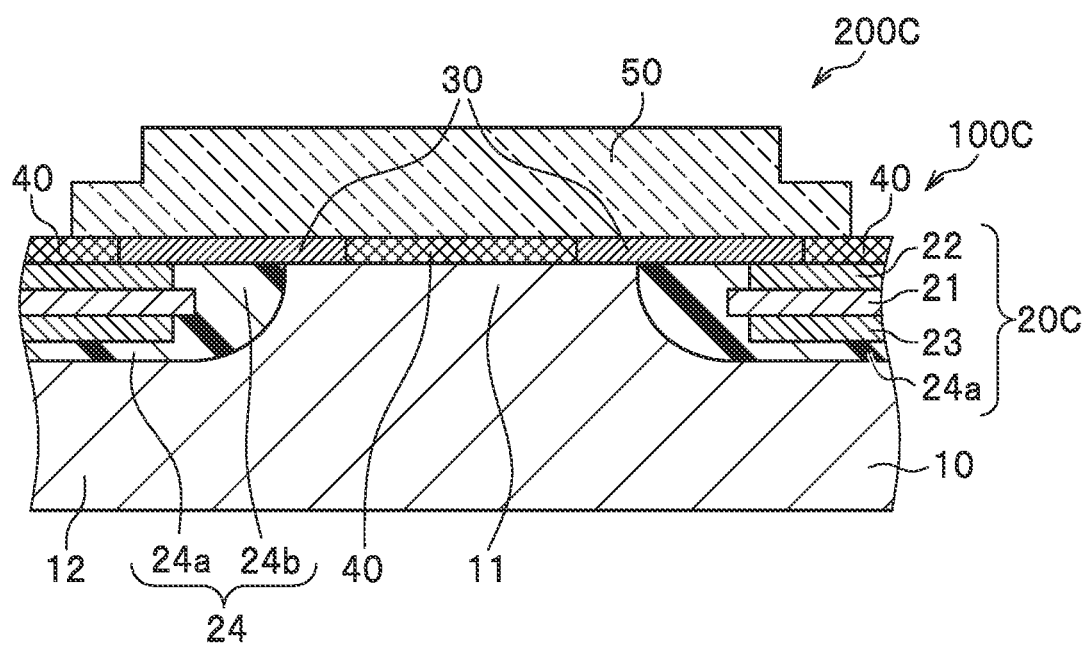
FIG. 16D is a cross-sectional view schematically illustrating an example of a light emitting device according to the modification example 3.

FIG. 16A is a plan view schematically illustrating an example of a circuit board according to a modification example 3. FIG. 16B is a plan view in which an adhesive member is removed in FIG. 16A. FIG. 16C is a schematic cross-sectional view taken along line XVIC-XVIC of FIG. 16A. FIG. 16D is a cross-sectional view schematically illustrating an example of a light emitting device according to the modification example 3.

In a circuit board 100C and a light emitting device 200C, in the plan view, the opening portion 25 of a second board 20C has a substantially quadrangular shape, and the pair of electrodes 22a and 22b are each disposed at a position facing the corresponding one of a pair of opposing sides of the substantially quadrangular shape. Furthermore, each of the pair of opposing sides of the substantially quadrangular shape includes opening extension regions 25RE2 that partially expand the opening region 25R (opening area) of the opening portion 25 in direction of the corresponding one of the pair of electrodes 22a and 22b. Each opening extension region 25RE2 is formed in a substantially quadrangular shape. Because the second board 20C has the opening extension region 25RE2, the width W of the base material exposed portion 215 between the opening extension region 25RE2 and the circuit pattern 22 is less than a width of the base material exposed portion 215 between a portion having no opening extension region 25RE2 and the circuit pattern 22. Furthermore, in the portion having the opening extension region 25RE2, the distance D between the lateral surface of the post portion 11 and the lateral surface of the base material 21 facing the lateral surface of the post portion 11 is greater than a distance between the lateral surface of the post portion 11 and the lateral surface of the base material 21 facing the lateral surface of the post portion 11 in the portion having no opening extension region 25RE2. The adhesive member 24 is disposed to surround the periphery of the post portion 11 in the plan view.

The fact that the opening portion 25 has a substantially quadrangular shape means a shape similar to a quadrangle and means that the opening portion 25 has a quadrangular shape when there is no opening extension regions 25RE2 in the modification example 3. In the modification example 3, because each side facing the corresponding one of the pair of electrodes 22a and 22b is not straight and includes the opening extension regions 25RE2 that partially expand the opening region 25R (opening area), the opening portion 25 is formed in a concave-convex state at one of opening sides facing each other in the plan view.

The fact that the opening extension region 25RE2 has a substantially quadrangular shape also includes, for example, a configuration in which one or both of an upper side and a lower side are curved rather than linear. Moreover, the fact that the opening extension region 25RE2 has a substantially quadrangular shape also includes a configuration in which one or both of a left side and a right side are curved rather than linear. Furthermore, the fact that the opening extension region 25RE2 has a substantially quadrangular shape also includes a configuration in which one or more of four corners of a quadrangle is not an acute or an obtuse but is arcuate. Note that the fact that the opening extension region 25RE2 has a substantially quadrangular shape means that the shape of the opening extension region 25RE2 becomes quadrangular when a straight line is drawn at the boundary between the opening extension region 25RE2 and the opening region 25R (opening area). In the modification example 3, the quadrangular shape means a rectangular shape. However, the shape of the opening extension region 25RE2 is not limited to a rectangular and may be, for example, a square, a trapezoidal, a triangular, an arc, or other shapes.

With such a configuration, the adhesive member 24 is likely to flow into the opening portion 25 via the opening extension regions 25RE2 and is likely to be disposed in the opening portion 25. For example, even if a slight position shift occurs when the first board 10 and the second board 20C are bonded to each other, the adhesive member 24 is likely to be disposed in the opening portion 25 via the opening extension regions 25RE2.

In order to obtain such a configuration, the second board 20C may be provided in the board providing step.

Modification Example 4

Figure 17A:
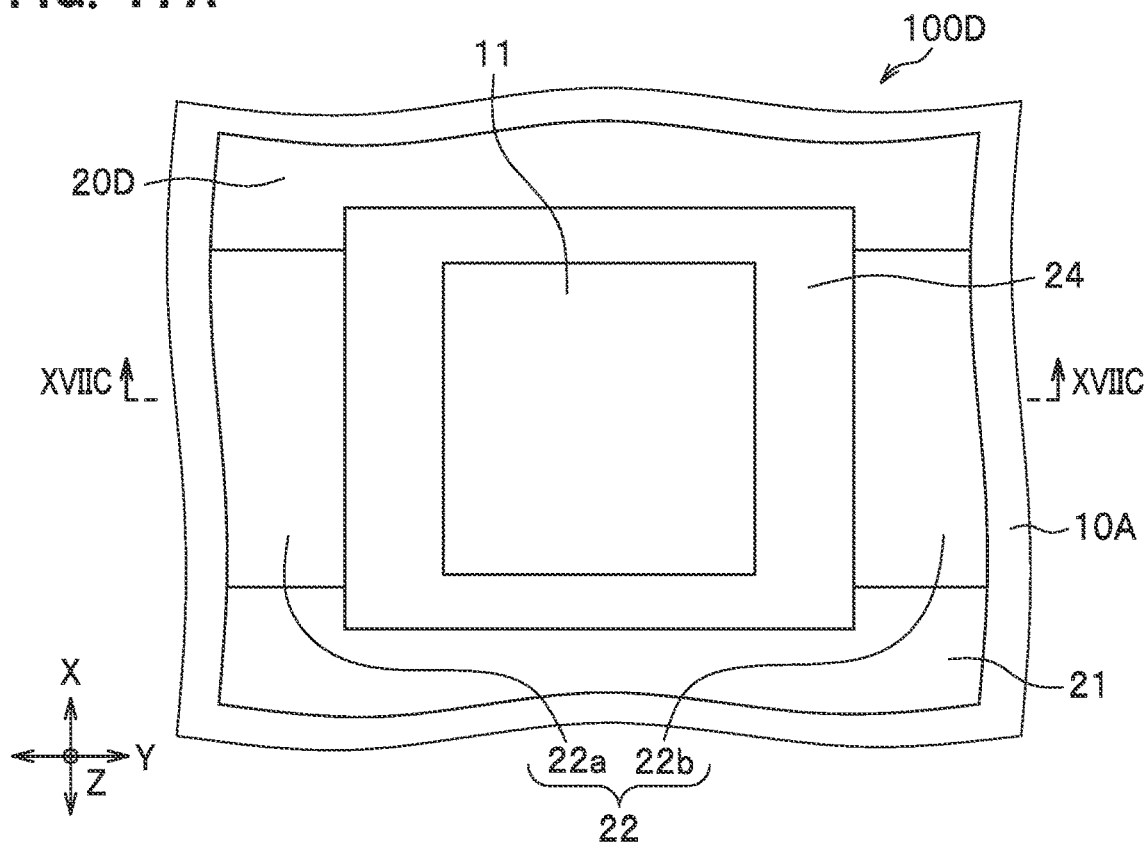
FIG. 17A is a plan view schematically illustrating an example of a circuit board according to a modification example 4.
Figure 17B:
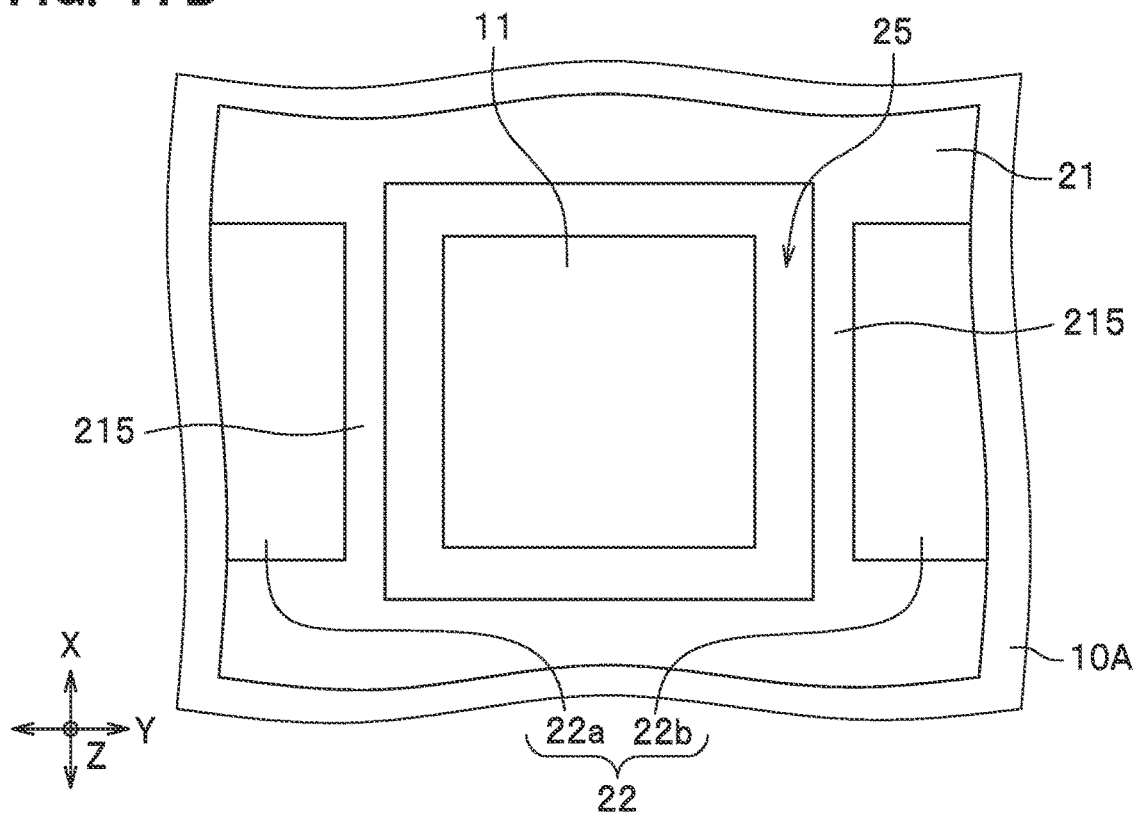
FIG. 17B is a plan view in which an adhesive member is removed in FIG. 17A.
Figure 17C:
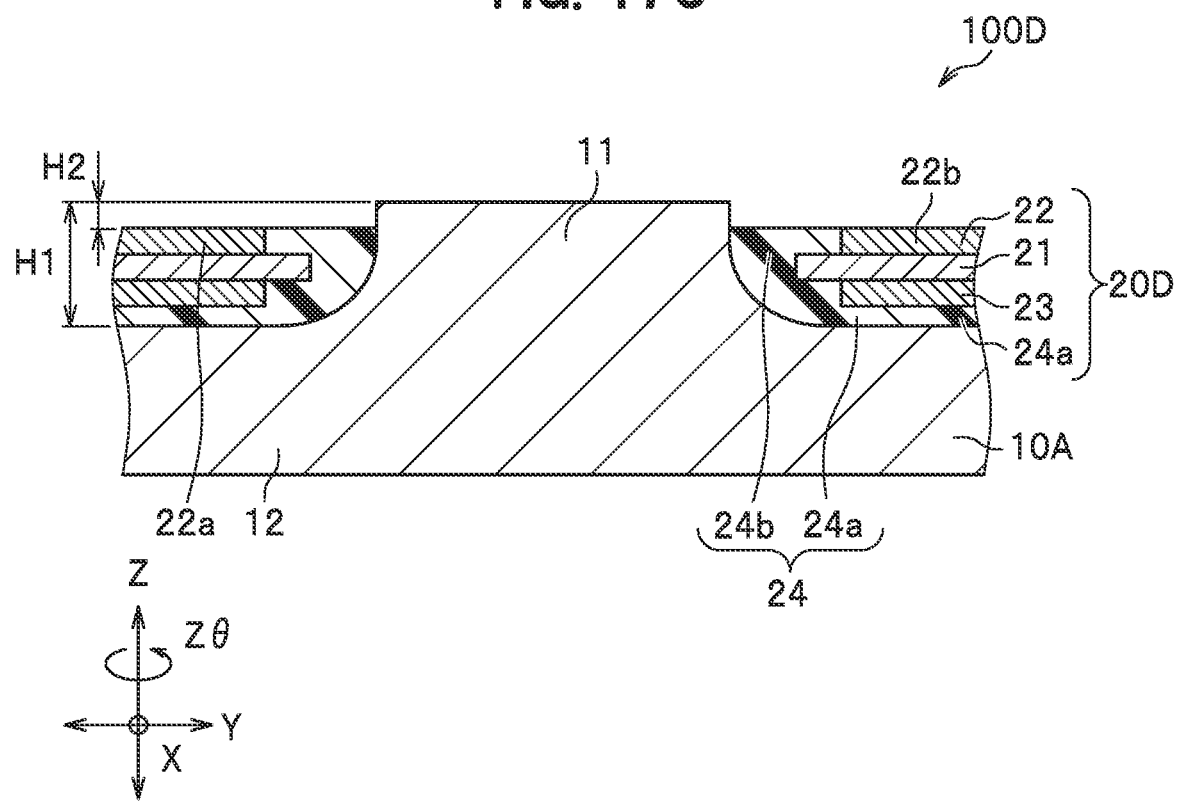
FIG. 17C is a schematic cross-sectional view taken along line XVIIC-XVIIC of FIG. 17A.
Figure 17D:
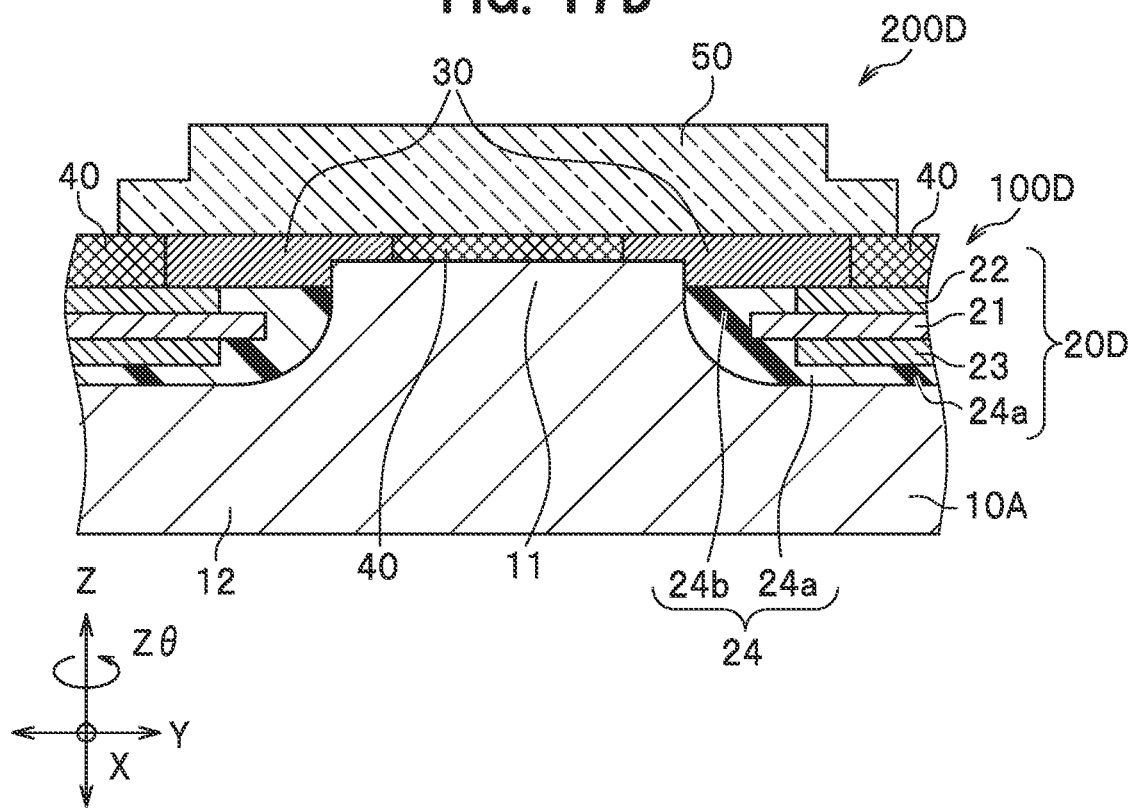
FIG. 17D is a cross-sectional view schematically illustrating an example of a light emitting device according to the modification example 4.

FIG. 17A is a plan view schematically illustrating an example of a circuit board according to a modification example 4. FIG. 17B is a plan view in which an adhesive member is removed in FIG. 17A. FIG. 17C is a schematic cross-sectional view taken along line XVIIC-XVIIC of FIG. 17A. FIG. 17D is a cross-sectional view schematically illustrating an example of a light emitting device according to the modification example 4.

The circuit board and the light emitting device may have a configuration in which the area of a top surface of a post portion is greater than the area of a top surface of each of a pair of electrodes in the plan view, and the height of the top surface of the post portion is identical to a height of a top surface of a circuit pattern or greater than the height of the top surface of the circuit pattern in the cross-sectional view. Hereinafter, a configuration in which the height of the top surface of the post portion is greater than the height of the top surface of the circuit pattern will be described as an example.

In the plan view, in a circuit board 100D and a light emitting device 200D, the area of the top surface of the post portion 11 of a first board 10A is greater than the area of the top surface of the first electrode 22a and greater than the area of the top surface of the second electrode 22b. Furthermore, in the cross-sectional view, in the circuit board 100D and the light emitting device 200D, the height of the top surface of the post portion 11 of the first board 10A is greater than the height of the top surface of the circuit pattern 22.

With such a configuration, rotation of the light emitting component 50 in a Zθ direction is suppressed, so that the light emitting component 50 can be stabilized in the Zθ direction. This makes it possible to further suppress position shift of the light emitting component 50 in the Zθ direction. Note that the Zθ direction means the circumferential direction of a virtual circle with a Z-axis at any position as a rotation center axis on a plane formed by an X-axis direction and a Y-axis direction.

The area of the top surface of the post portion 11 is preferably 5 times or more, and more preferably 10 times or more, when the area of the top surface of the first electrode 22a is 1. For example, the upper limit is preferably 15 times or less. Likewise, the area of the top surface of the post portion 11 is preferably 5 times or more, and more preferably 10 times or more, when the area of the top surface of the second electrode 22b is 1. For example, the upper limit is preferably 15 times or less.

In a case in which the area of each of the top surfaces of the pair of electrodes 22a and 22b is set to 1, if the area of the top surface of the post portion 11 is 5 times or more, the light emitting component 50 is easily stabilized in the Zθ direction. If the area of the top surface of the post portion 11 is 10 times or more, the light emitting component 50 is more easily stabilized in the Zθ direction. On the other hand, if the area of the top surface of the post portion 11 is 15 times or less, the light emitting component 50 is easily placed on the circuit board 100D.

Note that, although FIGS. 17A and 17B are plan views similar to FIGS. 1A and 1B, the ratio of the area of the top surface of the post portion 11 to the area of each of the top surfaces of the pair of electrodes 22a and 22b and the plan view shape may be adjusted as appropriate according to a desired configuration.

A height H2 from the top surface of the circuit pattern 22 to the top surface of the post portion 11 is preferably in a range from 5 μm to 50 μm, and more preferably in a range from 10 μm to 30 μm. If the height H2 from the top surface of the circuit pattern 22 to the top surface of the post portion 11 is 5 μm or greater, the light emitting component 50 is easily stabilized in the Zθ direction. On the other hand, if the height H2 from the top surface of the circuit pattern 22 to the top surface of the post portion 11 is 50 μm or less, the resist 30 and the plating layer 40 are easily formed and the light emitting component 50 is easily placed on the circuit board 100D. Furthermore, if the height H2 from the top surface of the circuit pattern 22 to the top surface of the post portion 11 is 30 μm or less, the resist 30 and the plating layer 40 are more easily formed, and the light emitting component 50 is more easily placed on the circuit board 100D.

Note that from the perspective of preventing the generation of voids when forming the resist 30, the height H2 from the top surface of the circuit pattern 22 to the top surface of the post portion 11 may be 0 μm, that is, the height of the top surface of the post portion 11 may be identical to the height of the top surface of the circuit pattern 22.

The height H1 of the post portion 11 can be, for example, in a range from 100 μm to 200 μm.

In order to obtain such a configuration, the first board 10A and a second board 20D may be provided in the board providing step.

Modification Example 5

Figure 18:
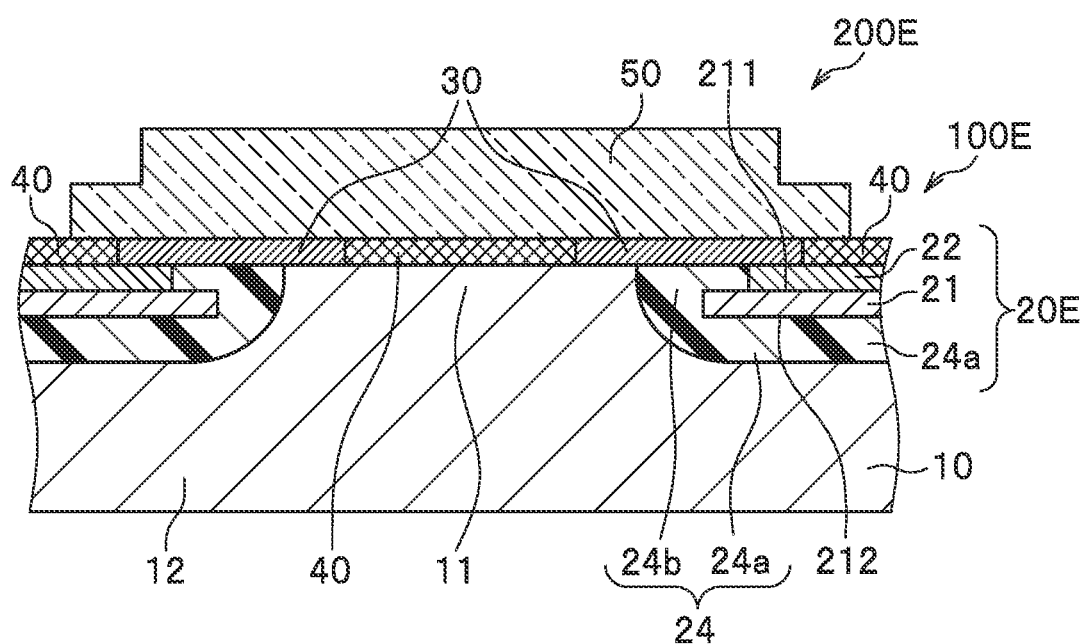
FIG. 18 is a cross-sectional view schematically illustrating an example of a light emitting device according to a modification example 5.

FIG. 18 is a cross-sectional view schematically illustrating an example of a light emitting device according to a modification example 5.

In a circuit board 100E and a light emitting device 200E, a second board 20E has no metal layer on the second surface 212 of the base material 21, the circuit pattern 22 is disposed on the first surface 211 of the base material 21, and the adhesive member 24a is disposed on the second surface 212 of the base material 21.

With such a configuration, the thickness of the circuit board 100E and the light emitting device 200E can be reduced.

The circuit board 100E and the light emitting device 200E can be manufactured by using, for example, a commercially available single-sided copper clad laminate, in which a copper foil that is the metal layer 122 is provided on the first surface 211 of the base material 21, in the board providing step. Note that the metal layer 122 such as a copper foil may be joined to the first surface 211 of the base material 21 without using the commercially available single-sided copper clad laminate.

In addition, for example, the plating layer may be provided partially or may not be provided. In a portion where no plating layer is provided may be a portion where the first board and the circuit pattern are exposed. Furthermore, as will be described below, an elongated resist may be provided on the top surface of the post portion. The second board includes an adhesive member on the second surface of the base material, but the one with no adhesive member may be used as the second board and an adhesive member separately provided may be used when the second board is bonded to the first board.

Furthermore, the method for manufacturing the circuit board and the light emitting device may include other steps between, before, or after the steps within a range in which the steps are not adversely affected. For example, a step of removing foreign matter mixed during manufacturing can be included.

APPLICATION EXAMPLES

Subsequently, an example of application examples of a circuit board and a light emitting device using a semiconductor laser element will be described. Note that, as an example of the application examples, the configuration of the circuit board and the light emitting device is slightly different from the embodiment described above. In this manner, the circuit board and the light emitting device of the embodiment can be applied to various forms.

Application Example 1

Figure 19A:
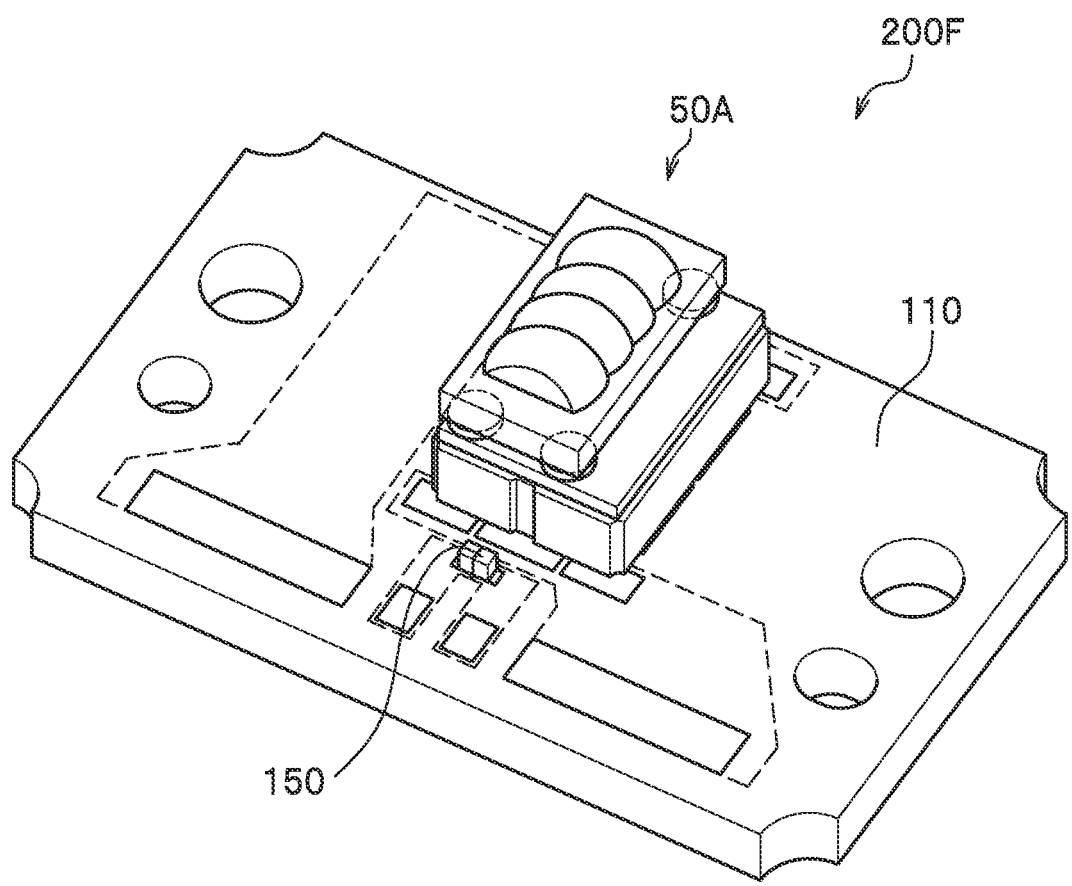
FIG. 19A is a perspective view schematically illustrating an example of a light emitting device according to an application example 1.
Figure 19A:
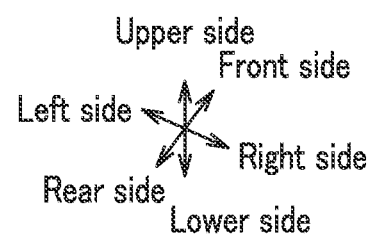
Figure 19B:
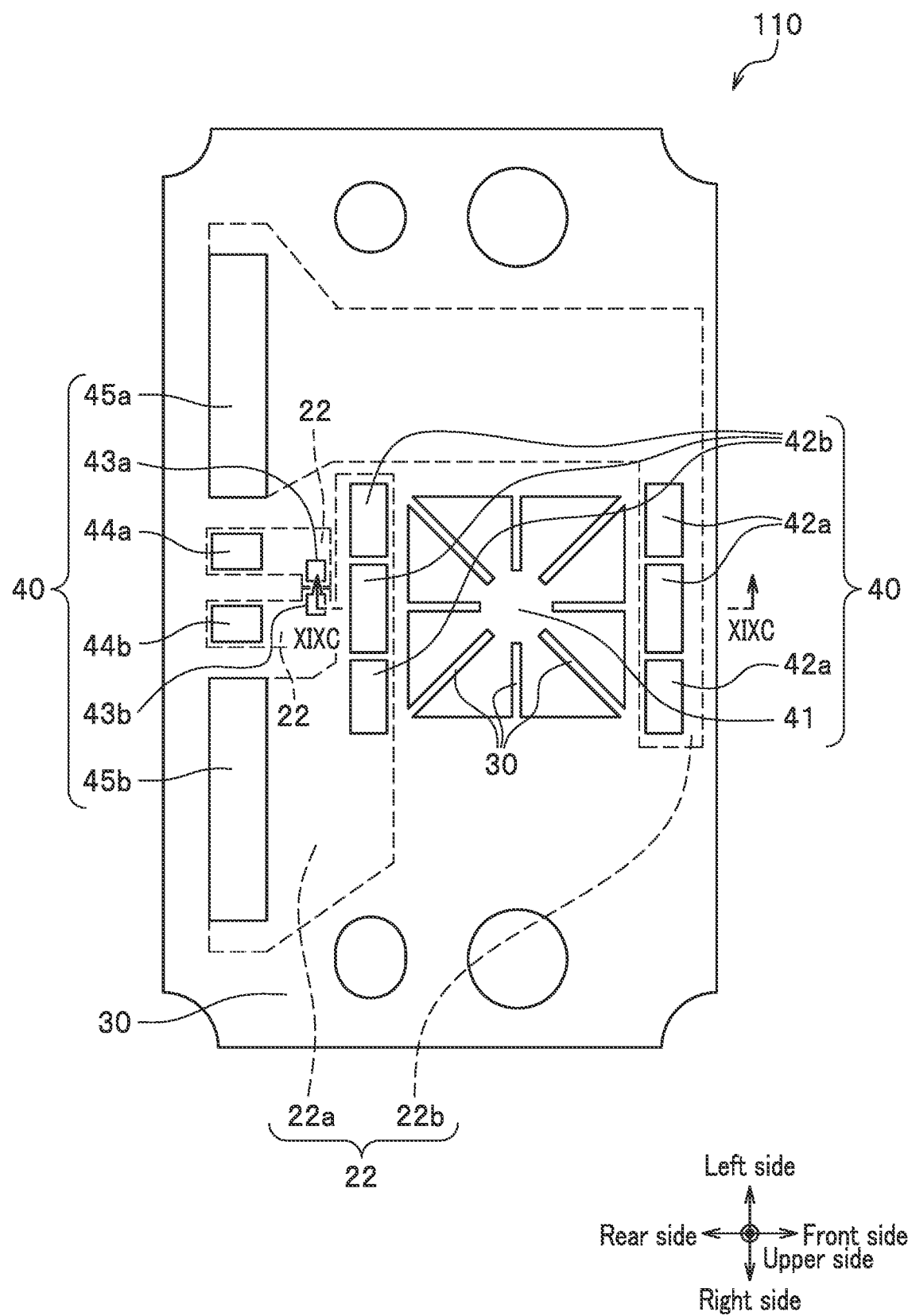
FIG. 19B is a plan view schematically illustrating an example of the configuration of a wiring board of the light emitting device according to the application example 1.
Figure 19C:
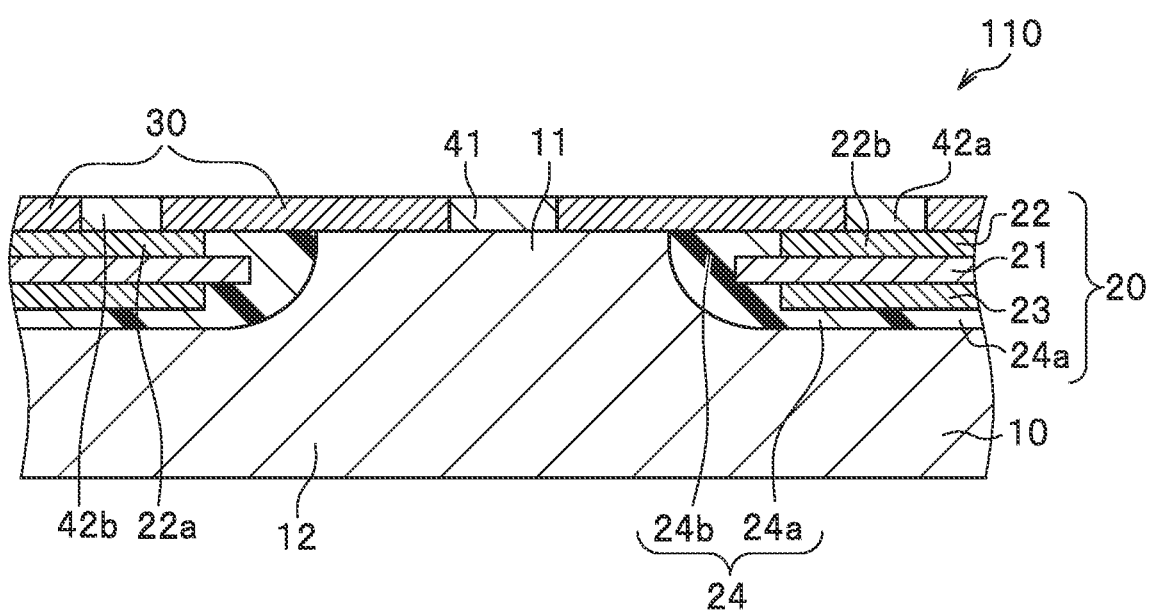
FIG. 19C is a schematic cross-sectional view taken along line XIXC-XIXC of FIG. 19B.
Figure 20A:
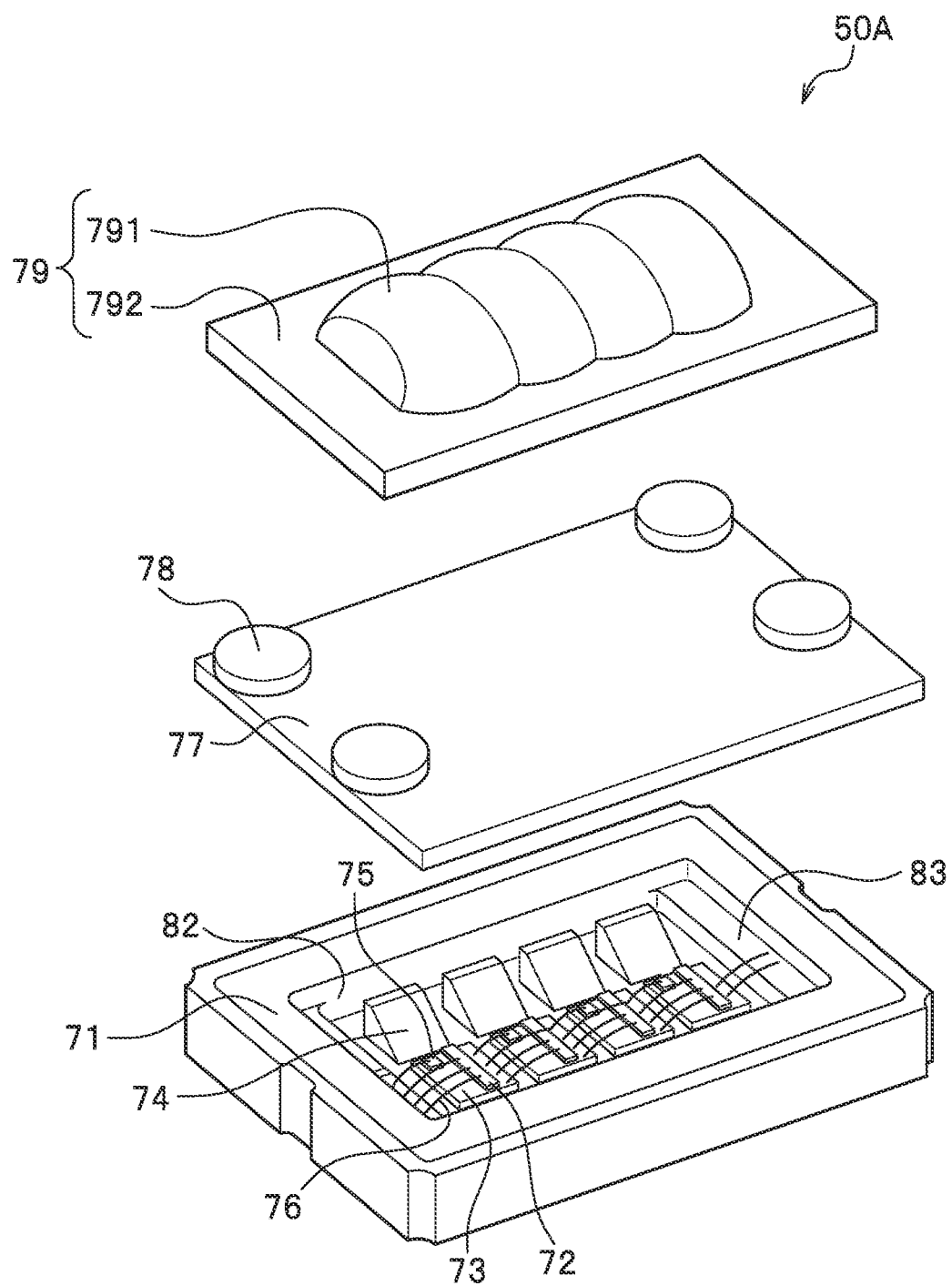
FIG. 20A is an exploded perspective view schematically illustrating an example of the configuration of a light emitting component.
Figure 20C:
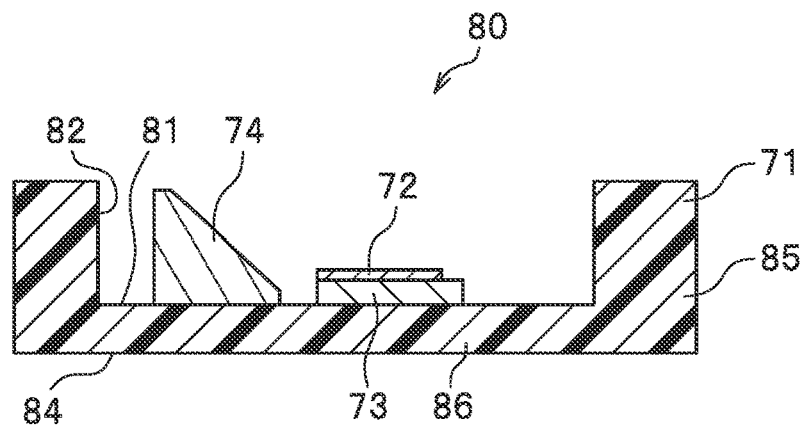
FIG. 20C is a schematic cross-sectional view taken along line XXC-XXC of FIG. 20B.
Figure 20D:
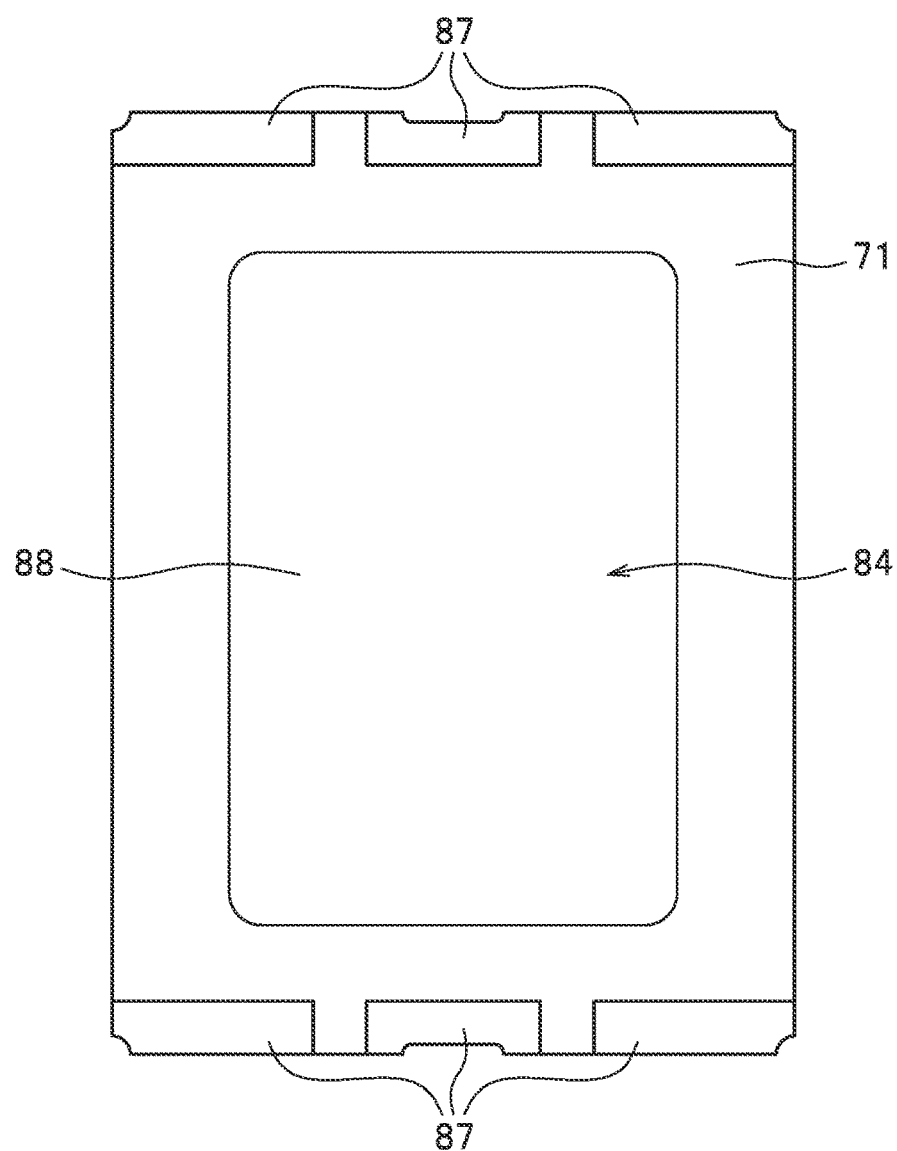
FIG. 20D is a bottom view schematically illustrating the configuration of a bottom surface of the light emitting component.
Figure 21:
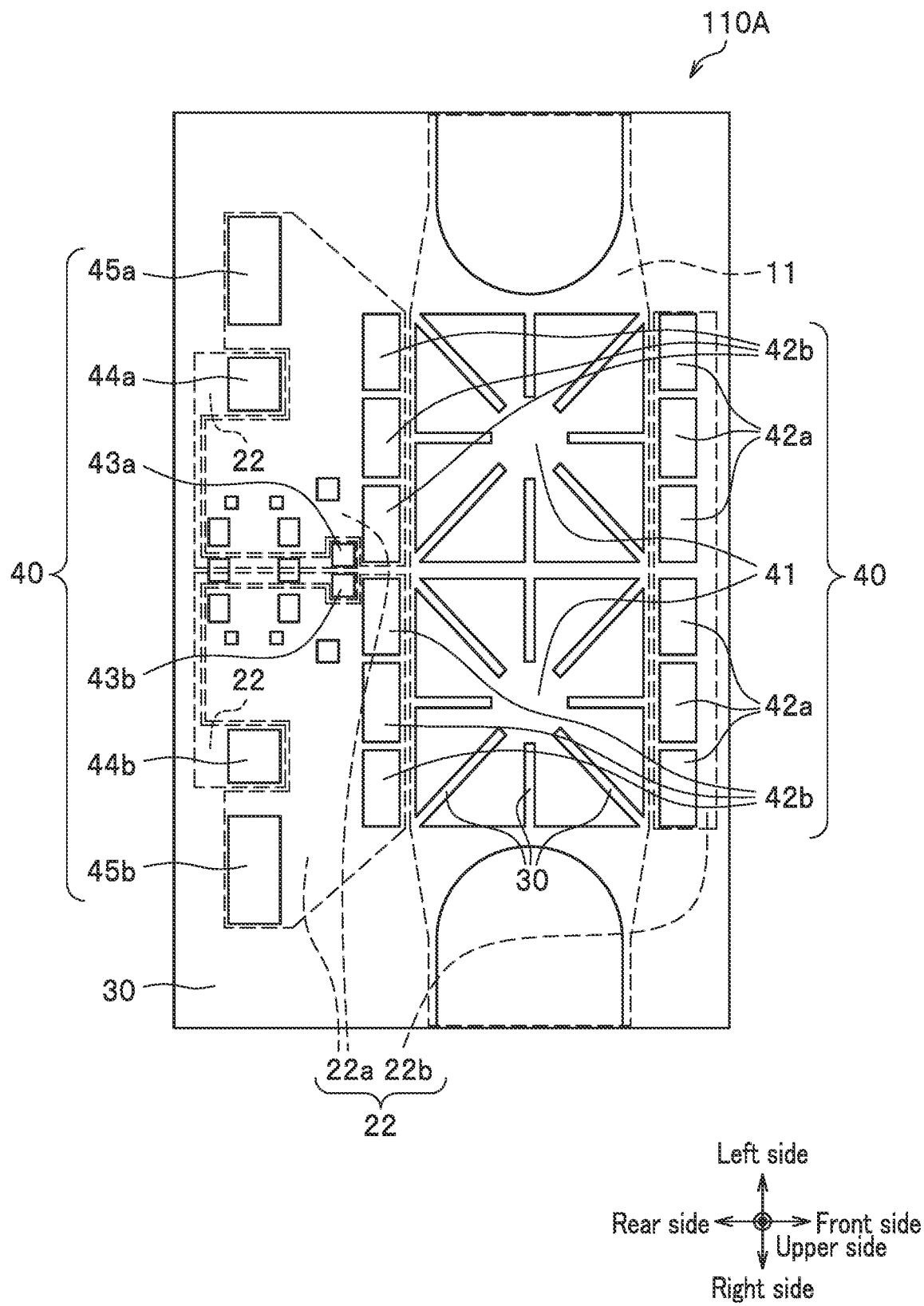
FIG. 21 is a plan view schematically illustrating an example of the configuration of a wiring board of the light emitting device according to the application example 2.

FIG. 19A is a perspective view schematically illustrating an example of a light emitting device according to an application example 1. FIG. 19B is a plan view schematically illustrating an example of the configuration of a wiring board of the light emitting device according to the application example 1. FIG. 19C is schematic cross-sectional view taken along line XIXC-XIXC of FIG. 19B. FIG. 20A is an exploded perspective view schematically illustrating an example of the configuration of a light emitting component. FIG. 20B is a plan view schematically illustrating the configuration of the light emitting component in a package. FIG. 20C is a schematic cross-sectional view taken along line XXC-XXC of FIG. 20B. FIG. 20D is a bottom view schematically illustrating the configuration of a bottom surface of the light emitting component. The axes are shown in FIGS. 19A, 19B and 21 to indicate directions (i.e., front side, rear side, left side, right side, upper side, and lower side) with respect to the light emitting device.

A light emitting device 200F includes at least a wiring board 110 (circuit board), a light emitting component 50A, and a thermistor 150.

The wiring board 110 includes at least the resist 30 and the plating layer 40 on the top surface. The plating layer 40 includes a plating layer 41, plating layers 42a and 42b, plating layers 43a and 43b, plating layers 44a and 44b, and plating layers 45a and 45b. The wiring board 110 further includes the circuit pattern 22 including the pair of electrodes 22a and 22b under the resist 30 and the plating layer 40.

The plating layer 41 is a plating layer in a central region on which the light emitting component 50A is placed. The plating layers 42a are plating layers in a front region on which the light emitting component 50A is placed. The plating layers 42b are plating layers in a rear region on which the light emitting component 50A is placed. The plating layers 43a and 43b are plating layers in a region where the thermistor 150 is placed. The plating layers 44a and 44b are plating layers in a predetermined region for a thermistor inspection terminal. The plating layers 45a and 45b are plating layers in a predetermined region for a laser element inspection terminal.

The plating layer 41 and the plating layers 42a and 42b are portions where the light emitting component 50A is placed. The plating layers 43a and 43b are portions where the thermistor 150 is placed. In a region formed in a rectangular shape in the plan view, a plurality of elongated resists 30 are disposed on the portion of the plating layer 41 to extend from the periphery of the rectangular shape toward the center. The plating layer 41 is a portion where the resists 30 are not disposed in the region formed in the rectangular shape. In the light emitting device, when the light emitting component is placed on the post portion, air bubbles may remain between the post portion and the light emitting component. In the light emitting device 200F, because the wiring board 110 includes the plurality of elongated resists 30 on the top surface of the post portion 11, air bubbles are easily dispersed via the elongated resists 30. This improves the heat dissipation of the wiring board 110.

The resists 30 are provided on the top surface of the wiring board 110 excluding the plating layer 40. Three plating layers 42a are provided in front of the plating layer 41 in a plan view. Three plating layers 42b are provided behind the plating layer 41 in a plan view. The plating layer 42a and the plating layer 42b provided in pair in the front-rear direction across the plating layer 41 are joined to metal films 87 provided on the bottom surface of the light emitting component 50A, thereby being electrically connected from one to the other.

The plating layers 42a and the plating layer 45a are electrically connected via the circuit pattern 22 (second electrode 22b). The plating layers 42b and the plating layer 45b are electrically connected via the circuit pattern 22 (first electrode 22a). The plating layers 45a and 45b function as laser element inspection terminals. The plating layer 43a and the plating layer 44a are electrically connected via the circuit pattern 22. The plating layer 43b and the plating layer 44b are electrically connected via the circuit pattern 22. The plating layers 44a and 44b function as thermistor inspection terminals. The thermistor 150 is an example of a temperature detecting element used for measuring the temperature when the light emitting device 200F is operating. The thermistor 150 is placed in a state of being connected to the plating layer 43a and the plating layer 43b, thereby enabling conduction from the plating layer 43a to the plating layer 43b through the thermistor 150.

The light emitting component 50A includes a package 71, semiconductor laser elements 72, submounts 73, light reflecting members 74, protecting elements 75, wires 76, a lid member 77, adhesive portions 78, and a lens member 79.

The package 71 includes a recessed portion 80 having a rectangular shape in a plan view. Here, the rectangular shape includes a substantially rectangular shape such as a shape in which a corner portion or a portion of a lateral surface is cut out like the package 71 or a shape in which a corner portion is curved like the recessed portion 80. Additionally, in the package 71, stepped portions 83 are formed on two inner lateral surfaces 82 in the short side direction facing each other among the four inner lateral surfaces 82 of the recessed portion 80. The package 71 may be formed using ceramic as a main material. Note that the package 71 may be formed of metal not limited to ceramic. For example, in the case of ceramics, aluminum nitride, silicon nitride, aluminum oxide, or silicon carbide can be used as the main material of the package 71. In the case of metals, the main material of the package 71 may be copper, aluminum, or iron as a metal, or copper molybdenum, copper-diamond composite material, or copper tungsten as a composite.

A metal film is provided on each of the bottom surface 84 of the package 71 and the top surfaces of the stepped portions 83 of the package 71. The metal film on the bottom surface 84 of the package 71 includes metal films 87 paired at both ends of the package 71, and a metal film 88 provided at the center of the bottom surface 84 of the package 71 sandwiched by the metal films 87 at both ends of the package 71. Each of the metal films 87 is separated from each other at three locations along the corresponding one of two sides facing each other. The metal films 87 are formed facing each other to be connected to the plating layers 42a and 42b of the wiring board 110. The metal film 88 can be connected to the plating layer 41 of the wiring board 110. In the package 71, the metal films on the top surfaces of the corresponding stepped portions 83 and the metal films 87 on the bottom surface 84 are electrically connected to each other by the metal wiring lines passing through the inside of the package 71.

The semiconductor laser element 72 and the protecting element 75 are electrically connected to the connecting wiring line, which is a metal film provided on the top surface of the stepped portion 83. The wires 76 are joined for this conduction. Thus, the semiconductor laser element 72 and the protecting element 75 are electrically connected via the metal films 87 provided on the bottom surface 84 of the package 71.

In such a light emitting component 50A, the pair of metal films 87 provided on the bottom surface 84 of the package 71 are joined to the corresponding plating layers 42a and 42b of the wiring board 110. Furthermore, the metal film 88 provided at the center of the bottom surface 84 of the package 71 is joined to the plating layer 41 of the wiring board 110. The joining between the light emitting component 50A and the wiring board 110 can be performed by soldering.

The semiconductor laser element 72 is placed on a bottom surface 81 (top surface of a bottom portion 86) of the recessed portion 80 of the package 71 via the submount 73. A plurality of the semiconductor laser elements 72 placed on the light emitting component 50A are disposed side-by-side in one direction, specifically in the long side direction of the package 71. In addition, the directions of the emission end surfaces are aligned such that the semiconductor laser elements 72 to be placed emit laser beams in the same direction. The plurality of semiconductor laser elements 72 disposed side by side in one direction are electrically connected in series with the wires 76.

The bottom surface of the submount 73 is joined to the bottom surface 81 of the recessed portion 80 of the package 71 by an adhesive member such as Au paste, and the top surface of the submount 73 is joined to the semiconductor laser element 72. The submount 73 can be formed using, for example, silicon nitride, aluminum nitride, aluminum oxide, or silicon carbide. A metal film such as Cu plating is provided on the top surface of the submount 73.

The light reflecting member 74 is a member that reflects light from the semiconductor laser element 72. The bottom surface of the light reflecting member 74 is joined to the bottom surface 81 of the recessed portion 80 of the package 71 by the adhesive member. The adhesive member is formed by applying a mixture of particles of Ag, Au, Cu, or the like and an organic solvent, and then removing the organic solvent by heating to fuse the particles of Ag, Au, Cu, or the like. The light reflecting member 74 is independently disposed corresponding to each semiconductor laser element 72. The light reflecting member 74 includes the bottom surface, a top surface, lateral surfaces, and an inclined surface, and the inclined surface forms a light reflecting surface. The light reflecting surface is a flat surface and is inclined from the top surface to the bottom surface.

The light reflecting member 74 can be formed by forming an outer shape using the main material and then forming a light reflecting film on a surface of the formed outer shape on which a light reflecting surface is desired to be provided. As the main material, a heat-resistant material is preferable, and for example, glass such as quartz or borosilicate glass (BK7), metal such as aluminum, Si, or the like can be employed. The light reflecting film is preferably made of a material having high light reflectivity, and metals such as Ag and Al, dielectric multilayer films such as $Ta_2O_5/SiO_2$, $TiO_2/SiO_2$, and $Nb_2O_5/SiO_2$ can be employed. Note that when the outer shape of the light reflecting member 74 is formed using a material having high light reflectivity such as metal as a main material, the formation of the light reflecting film may be omitted.

The light reflecting surface of the light reflecting member 74 is irradiated with the main part of the light emitted from the corresponding semiconductor laser element 72. Note that the light emitting component may be a light emitting component in which the light reflecting member 74 is not provided and the emission end surface of the semiconductor laser element 72 faces upward.

The protecting element 75 is placed on the top surface of the submount 73. The protecting element 75 is a Zener diode, for example. The wires 76 are wiring lines made of metal. Examples of the material of the wires 76 include metals such as Au, Ag, Cu, Pt, and Al, and alloys thereof. Note that the light emitting component may not include the protecting element 75.

The lid member 77 is a member that covers the semiconductor laser elements 72 and the light reflecting members 74. The lid member 77 is entirely transparent but may partially have a non-light-transmissive region. The lid member 77 can be formed using sapphire as a main material. The lid member 77 is provided with metal films in some regions. In addition to sapphire, for example, glass, and the like can be used as a main material.

The bottom surface of the lid member 77 is joined to the top surface of the package 71 (the top surface of the frame portion 85). The lid member 77 and the package 71 are provided with a metal film in the region to be joined, and are fixed via Au—Sn, and the like. In the light emitting component 50A, a closed space is formed by joining the package 71 and the lid member 77. This closed space is an air-tightly sealed space. By air-tightly sealing the light emitting component 50A in this manner, dust such as organic substance can be inhibited from being collected on the light emission end surface of the semiconductor laser element 72.

The adhesive portions 78 are formed on the top surface of the lid member 77 and in a region where the lid member 77 and the lens member 79 are adhered. As the adhesive portion 78, for example, an ultraviolet curable resin can be used.

The lens member 79 faces the top surface of the lid member 77. The lens member 79 is formed integrally with lens portions 791 having lens shapes and a rectangular support plate portion 792 that supports the lens portions 791. In the lens member 79, each of the lens portions 791 is provided at a position facing the optical axis of the corresponding one of semiconductor laser elements 72. The arrangement and shape of each lens portion 791 are designed such that reflected light emitted from the corresponding one of semiconductor laser element 72 and reflected by the corresponding one of light reflecting members 74 passes through the lens portion 791 and is collimated. For example, glass such as BK7, B270, and the like can be used for the lens member 79.

Application Example 2

FIG. 21 is a plan view schematically illustrating an example of the configuration of a wiring board of the light emitting device according to the application example 2.

Hereinafter, a part mainly different from the application example 1 will be described. In the plan view, in a wiring board 110A (circuit board), the area of the top surface of the post portion 11 of a first board 10 is greater than the area of the top surface of the first electrode 22a and greater than the area of the top surface of the second electrode 22b. Furthermore, the wiring board 110A has two the central region on which the light emitting component 50A is placed.

The circuit board and the light emitting device according to the embodiment of the present disclosure can be used for various electronic devices.

The invention claimed is:
1. A circuit board comprising:
a first board including a flat plate portion and a post portion having a convex shape protruding from the flat plate portion; and
a second board including
a base material,
a circuit pattern including a pair of electrodes disposed on a first surface of the base material,
a metal layer disposed on a second surface of the base material opposite to the first surface, and
an adhesive member disposed on a surface of the metal layer opposite to a surface proximate to the base material,
the second board defining an opening portion extending through the base material in a thickness direction, wherein
the post portion is arranged in the opening portion with a top surface of the post portion is exposed from the second board, the top surface of the first board excluding the post portion and the metal layer in the second board facing each other with the adhesive member being interposed therebetween,
a thickness of the adhesive member between the flat plate portion of the first board and the metal layer is in a range from 20 μm to 100 μm,
in a plan view, the second board includes a base material exposed portion where the base material protrudes in a direction toward the opening portion further than the circuit pattern and is exposed from the circuit pattern,
in a cross-sectional view, the base material exposed portion is exposed from the metal layer,
the adhesive member is disposed between a lateral surface of the post portion and the second board, and
the top surface of the post portion, a top surface of the adhesive member disposed between the post portion and the second board, and a top surface of the circuit pattern are flush with each other.

2. The circuit board according to claim 1, wherein
an area of the top surface of the post portion is greater than an area of a top surface of each of the pair of electrodes in the plan view, and
a height of the top surface of the post portion is equal to or greater than a height of a top surface of the circuit pattern in a cross-sectional view.

3. A light emitting device comprising:
the circuit board according to claim 1; and
a light emitting component placed on the post portion of the circuit board.

4. The circuit board according to claim 1, wherein
a thickness of the flat plate portion is in a range from 1 mm to 3 mm.

5. The circuit board according to claim 1, wherein
a height of the post portion as measured from a top surface of the flat plate portion to the top surface of the post portion is in a range from 50 μm to 200 μm.

6. The circuit board according to claim 1, wherein
the first board is a metal plate using a metal material.

7. The circuit board according to claim 1, wherein
the first board is made of a material containing 90 mass % or greater of copper.

8. The circuit board according to claim 1, wherein
the second board is a multilayer board.

9. The circuit board according to claim 1, wherein
the base material is made of insulating material, and
a thickness of the base material is in a range from 12 μm to 50 μm.

10. The circuit board according to claim 1, wherein
the base material is made of glass epoxy, and
a thickness of the base material is in a range from 50 μm to 180 μm.

11. The circuit board according to claim 1, wherein
the metal layer is separated from the lateral surface of the post portion by 100 μm or greater.

12. The circuit board according to claim 1, wherein
a width of the base material exposed portion is 50 μm or greater and 200 μm or less.

13. The circuit board according to claim 1, wherein
a distance between the lateral surface of the post portion and a lateral surface of the base material facing the lateral surface of the post portion is in a range from 50 μm to 300 μm.

14. The circuit board according to claim 1, wherein
in the plan view,
the opening portion of the second board has a substantially quadrangular shape, and
the post portion of the first board has a substantially quadrangular shape.

15. The circuit board according to claim 1, wherein the adhesive member is disposed to surround periphery of the post portion in the plan view.

16. The circuit board according to claim 1, wherein the opening portion of second board includes an opening extension region that partially expands an opening region of the opening portion outward.

17. The circuit board according to claim 16, wherein
the opening extension region has a substantially quadrangular shape or an arc shape.

18. The circuit board according to claim 16, wherein
a width of the base material exposed portion between the opening extension region and the circuit pattern is less than a width of the base material exposed portion between a portion having no opening extension region and the circuit pattern.

19. The circuit board according to claim 16, wherein
in a portion having the opening extension region, a distance between the lateral surface of the post portion and a lateral surface of the base material facing the lateral surface of the post portion is greater than a distance between the lateral surface of the post portion and the lateral surface of the base material facing the lateral surface of the post portion in a portion having no opening extension region.

20. The circuit board according to claim 1, wherein
the opening portion is formed in a concave-convex state at one of opening sides facing each other in the plan view.

21. The light emitting device according to claim 3, wherein
a light emitting component is at least one component selected from a group consisting of a semiconductor laser element, an LED, and an organic electroluminescence element.

* * * * *